(12) United States Patent
Lai et al.

(10) Patent No.: US 9,972,504 B2
(45) Date of Patent: May 15, 2018

(54) ATOMIC LAYER ETCHING OF TUNGSTEN FOR ENHANCED TUNGSTEN DEPOSITION FILL

(71) Applicant: Lam Research Corporation, Fremont, CA (US)

(72) Inventors: Chiukin Steven Lai, Sunnyvale, CA (US); Keren Jacobs Kanarik, Los Altos, CA (US); Samantha Tan, Fremont, CA (US); Anand Chandrashekar, Sunnyvale, CA (US); Teh-tien Su, Milpitas, CA (US); Wenbing Yang, Fremont, CA (US); Michael Wood, San Jose, CA (US); Michal Danek, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

(21) Appl. No.: 14/830,683

(22) Filed: Aug. 19, 2015

(65) Prior Publication Data

US 2017/0040214 A1    Feb. 9, 2017

Related U.S. Application Data

(60) Provisional application No. 62/202,670, filed on Aug. 7, 2015.

(51) Int. Cl.
*H01L 21/768* (2006.01)
*H01L 21/3213* (2006.01)
*H01L 21/285* (2006.01)

(52) U.S. Cl.
CPC .. *H01L 21/32136* (2013.01); *H01L 21/76877* (2013.01); *H01L 21/28556* (2013.01)

(58) Field of Classification Search
CPC ................................................ H01L 21/76883
See application file for complete search history.

(56) References Cited

U.S. PATENT DOCUMENTS

| 4,592,801 A | 6/1986 | Hara et al. |
|---|---|---|
| 4,713,141 A | 12/1987 | Tsang |
| 4,714,520 A | 12/1987 | Gwozdz |
| 4,804,560 A | 2/1989 | Shioya et al. |
| 4,874,723 A | 10/1989 | Jucha et al. |
| 4,891,550 A | 1/1990 | Northrop et al. |

(Continued)

FOREIGN PATENT DOCUMENTS

| CN | 1552097 A | 12/2004 |
|---|---|---|
| CN | 101899649 A | 12/2010 |

(Continued)

OTHER PUBLICATIONS

Carver et al. "Atomic Layer Etching: An Industry Perspective," ECS Journal of Solid State Science and Technology, 4 (6) N5005-N5009, Published Feb. 20, 2015.*

(Continued)

*Primary Examiner* — Stephen Bradley
(74) *Attorney, Agent, or Firm* — Weaver Austin Villeneuve & Sampson LLP

(57) ABSTRACT

Methods of depositing tungsten into high aspect ratio features using a dep-etch-dep process integrating various deposition techniques with alternating pulses of surface modification and removal during etch are provided herein.

19 Claims, 9 Drawing Sheets

(56) References Cited

U.S. PATENT DOCUMENTS

| | | |
|---|---|---|
| 4,988,644 A | 1/1991 | Jucha et al. |
| 4,997,520 A | 3/1991 | Jucha et al. |
| 5,037,775 A | 8/1991 | Reisman |
| 5,147,500 A | 9/1992 | Tachi et al. |
| 5,164,330 A | 11/1992 | Davis et al. |
| 5,407,698 A | 4/1995 | Emesh |
| 5,431,774 A | 7/1995 | Douglas |
| 5,489,552 A | 2/1996 | Merchant et al. |
| 5,501,893 A | 3/1996 | Laermer et al. |
| 5,719,410 A | 2/1998 | Suehiro et al. |
| 5,747,379 A | 5/1998 | Huang et al. |
| 5,767,015 A | 6/1998 | Tabara |
| 5,785,796 A | 7/1998 | Lee |
| 5,807,786 A | 9/1998 | Chang |
| 5,833,817 A | 11/1998 | Tsai et al. |
| 5,861,671 A | 1/1999 | Tsai et al. |
| 5,866,483 A | 2/1999 | Shiau et al. |
| 5,893,758 A | 4/1999 | Sandhu et al. |
| 5,914,277 A | 6/1999 | Shinohara |
| 5,963,833 A | 10/1999 | Thakur |
| 5,990,020 A | 11/1999 | Ha |
| 6,011,311 A | 1/2000 | Hsing et al. |
| 6,013,575 A | 1/2000 | Itoh |
| 6,022,806 A | 2/2000 | Sato et al. |
| 6,030,881 A | 2/2000 | Papasouliotis et al. |
| 6,100,193 A | 8/2000 | Suehiro et al. |
| 6,110,822 A | 8/2000 | Huang et al. |
| 6,177,353 B1 | 1/2001 | Gutsche et al. |
| 6,184,158 B1 | 2/2001 | Shufflebotham et al. |
| 6,221,754 B1 | 4/2001 | Chiou et al. |
| 6,245,654 B1 | 6/2001 | Shih et al. |
| 6,376,376 B1 | 4/2002 | Lim et al. |
| 6,383,910 B2 | 5/2002 | Okada et al. |
| 6,432,830 B1 | 8/2002 | Merry |
| 6,436,809 B1 | 8/2002 | Kwag et al. |
| 6,448,192 B1 | 9/2002 | Kaushik |
| 6,482,745 B1 | 11/2002 | Hwang |
| 6,503,843 B1 | 1/2003 | Xia et al. |
| 6,593,233 B1 | 7/2003 | Miyazaki et al. |
| 6,607,985 B1 | 8/2003 | Kraft et al. |
| 6,635,965 B1 | 10/2003 | Lee et al. |
| 6,683,000 B2 | 1/2004 | Fukui et al. |
| 6,696,337 B2 | 2/2004 | Asano et al. |
| 6,828,226 B1 | 12/2004 | Chen et al. |
| 6,844,258 B1 | 1/2005 | Fair et al. |
| 6,872,323 B1 | 3/2005 | Entley et al. |
| 7,005,372 B2 | 2/2006 | Levy et al. |
| 7,026,246 B2 | 4/2006 | Yun |
| 7,115,516 B2 | 10/2006 | Chen et al. |
| 7,141,494 B2 | 11/2006 | Lee et al. |
| 7,193,369 B2 | 3/2007 | Min et al. |
| 7,196,955 B2 | 3/2007 | Nickel |
| 7,416,989 B1 | 8/2008 | Liu et al. |
| 7,427,568 B2 | 9/2008 | Chen et al. |
| 7,504,725 B2 | 3/2009 | Kim et al. |
| 7,578,944 B2 | 8/2009 | Min et al. |
| 7,589,017 B2 | 9/2009 | Chan et al. |
| 7,655,567 B1 | 2/2010 | Gao et al. |
| 7,772,114 B2 | 8/2010 | Chan et al. |
| 7,772,121 B2 | 8/2010 | Chen et al. |
| 7,795,148 B2 | 9/2010 | Brown |
| 7,955,972 B2 | 6/2011 | Chan et al. |
| 7,964,504 B1 | 6/2011 | Shaviv et al. |
| 7,993,460 B2 | 8/2011 | Steger |
| 8,058,170 B2 | 11/2011 | Chandrashekar et al. |
| 8,071,478 B2 | 12/2011 | Wu et al. |
| 8,119,527 B1 | 2/2012 | Chandrashekar et al. |
| 8,124,531 B2 | 2/2012 | Chandrashekar et al. |
| 8,129,270 B1 | 3/2012 | Chandrashekar et al. |
| 8,153,520 B1 | 4/2012 | Chandrashekar et al. |
| 8,252,194 B2 | 8/2012 | Kiehlbauch et al. |
| 8,262,800 B1 | 9/2012 | Wongsenakhum et al. |
| 8,399,351 B2 | 3/2013 | Takahashi |
| 8,409,985 B2 | 4/2013 | Chan et al. |
| 8,435,894 B2 | 5/2013 | Chandrashekar et al. |
| 8,501,620 B2 | 8/2013 | Chandrashekar et al. |
| 8,551,885 B2 | 10/2013 | Chen et al. |
| 8,747,960 B2 | 6/2014 | Dordi et al. |
| 8,808,561 B2 | 8/2014 | Kanarik |
| 8,835,317 B2 | 9/2014 | Chandrashekar et al. |
| 8,883,028 B2 | 11/2014 | Kanarik |
| 8,883,637 B2 | 11/2014 | Jeng et al. |
| 8,993,352 B2 | 3/2015 | Nishimura et al. |
| 9,034,768 B2 | 5/2015 | Chandrashekar et al. |
| 9,082,826 B2 | 7/2015 | Chandrashekar et al. |
| 9,130,158 B1 | 9/2015 | Shen et al. |
| 9,190,293 B2 | 11/2015 | Wang et al. |
| 9,240,347 B2 | 1/2016 | Chandrashekar et al. |
| 9,257,638 B2 | 2/2016 | Tan et al. |
| 9,299,575 B2 | 3/2016 | Park et al. |
| 9,449,843 B1 | 9/2016 | Korolik et al. |
| 9,548,228 B2 | 1/2017 | Chandrashekar et al. |
| 9,576,811 B2 | 2/2017 | Kanarik et al. |
| 9,589,835 B2 | 3/2017 | Chandrashekar et al. |
| 9,653,353 B2 | 5/2017 | Chandrashekar et al. |
| 9,805,941 B2 | 10/2017 | Kanarik et al. |
| 9,806,252 B2 | 10/2017 | Tan et al. |
| 9,837,312 B1 | 12/2017 | Tan et al. |
| 9,870,899 B2 | 1/2018 | Yang et al. |
| 2001/0053585 A1 | 12/2001 | Kikuchi et al. |
| 2002/0009883 A1 | 1/2002 | Ogure et al. |
| 2002/0058409 A1 | 5/2002 | Lin et al. |
| 2002/0081381 A1 | 6/2002 | DelaRosa et al. |
| 2002/0090811 A1 | 7/2002 | Kim et al. |
| 2002/0132472 A1 | 9/2002 | Park |
| 2002/0177325 A1 | 11/2002 | Takewaka et al. |
| 2003/0017701 A1 | 1/2003 | Nakahara et al. |
| 2003/0082902 A1 | 5/2003 | Fukui et al. |
| 2003/0109145 A1 | 6/2003 | Yun |
| 2003/0190802 A1 | 10/2003 | Wang et al. |
| 2003/0194850 A1 | 10/2003 | Lewis et al. |
| 2003/0235995 A1 | 12/2003 | Oluseyi et al. |
| 2004/0004056 A1 | 1/2004 | Sasaki et al. |
| 2004/0025091 A1 | 2/2004 | Totman et al. |
| 2004/0077161 A1 | 4/2004 | Chen et al. |
| 2004/0079632 A1 | 4/2004 | Ahmad et al. |
| 2004/0137749 A1 | 7/2004 | Ying et al. |
| 2004/0142557 A1 | 7/2004 | Levy et al. |
| 2004/0209476 A1 | 10/2004 | Ying et al. |
| 2004/0245091 A1 | 12/2004 | Karim et al. |
| 2004/0266174 A1 | 12/2004 | Yang et al. |
| 2005/0006222 A1* | 1/2005 | Ding ............ C23C 14/358 204/192.1 |
| 2005/0031786 A1 | 2/2005 | Lee et al. |
| 2005/0042829 A1 | 2/2005 | Kim et al. |
| 2005/0098440 A1 | 5/2005 | Kailasam et al. |
| 2005/0179141 A1 | 8/2005 | Yun et al. |
| 2005/0250316 A1 | 11/2005 | Choi et al. |
| 2005/0275941 A1 | 12/2005 | Liu et al. |
| 2006/0009040 A1 | 1/2006 | Tomioka et al. |
| 2006/0075966 A1 | 4/2006 | Chen et al. |
| 2006/0084269 A1 | 4/2006 | Min et al. |
| 2006/0094238 A1 | 5/2006 | Levy et al. |
| 2006/0194435 A1 | 8/2006 | Nishimura et al. |
| 2006/0214244 A1 | 9/2006 | Minakata |
| 2007/0006893 A1 | 1/2007 | Ji |
| 2007/0049036 A1 | 3/2007 | Huang |
| 2007/0187362 A1 | 8/2007 | Nakagawa et al. |
| 2007/0202254 A1 | 8/2007 | Ganguli et al. |
| 2007/0238301 A1 | 10/2007 | Cabral et al. |
| 2007/0246442 A1 | 10/2007 | America et al. |
| 2007/0264105 A1 | 11/2007 | Pharand et al. |
| 2007/0298585 A1 | 12/2007 | Lubomirsky et al. |
| 2008/0054468 A1 | 3/2008 | Choi et al. |
| 2008/0054472 A1 | 3/2008 | Shinriki et al. |
| 2008/0254623 A1 | 10/2008 | Chan et al. |
| 2008/0318417 A1 | 12/2008 | Shinriki et al. |
| 2009/0020884 A1 | 1/2009 | Lee et al. |
| 2009/0053893 A1 | 2/2009 | Khandelwal et al. |
| 2009/0163025 A1 | 6/2009 | Humayun et al. |
| 2009/0226611 A1 | 9/2009 | Suzuki et al. |
| 2009/0256220 A1 | 10/2009 | Horng et al. |
| 2009/0286381 A1 | 11/2009 | van Schravendijk et al. |
| 2010/0072623 A1 | 3/2010 | Prindle et al. |

(56) References Cited

U.S. PATENT DOCUMENTS

| | | | |
|---|---|---|---|
| 2010/0130002 A1 | 5/2010 | Dao et al. | |
| 2010/0144140 A1 | 6/2010 | Chandrashekar et al. | |
| 2010/0159694 A1 | 6/2010 | Chandrashekar et al. | |
| 2010/0240212 A1 | 9/2010 | Takahashi | |
| 2010/0267230 A1 | 10/2010 | Chandrashekar et al. | |
| 2010/0267235 A1 | 10/2010 | Chen et al. | |
| 2011/0139748 A1 | 6/2011 | Donnelly et al. | |
| 2011/0151670 A1 | 6/2011 | Lee et al. | |
| 2011/0159690 A1 | 6/2011 | Chandrashekar et al. | |
| 2011/0212274 A1* | 9/2011 | Selsley | C23C 14/5826 427/540 |
| 2011/0233778 A1 | 9/2011 | Lee et al. | |
| 2012/0009785 A1* | 1/2012 | Chandrashekar | C23C 16/045 438/669 |
| 2012/0077342 A1 | 3/2012 | Gao et al. | |
| 2012/0115329 A1* | 5/2012 | Chandrashekar | H01L 21/28556 438/675 |
| 2012/0164832 A1 | 6/2012 | Chandrashekar et al. | |
| 2012/0276657 A1 | 11/2012 | Joubert et al. | |
| 2013/0062677 A1 | 3/2013 | Li et al. | |
| 2013/0105303 A1* | 5/2013 | Lubomirsky | H01J 37/32091 204/192.34 |
| 2013/0168354 A1* | 7/2013 | Kanarik | H01J 37/32082 216/68 |
| 2013/0171822 A1 | 7/2013 | Chandrashekar et al. | |
| 2013/0302980 A1 | 11/2013 | Chandrashekar et al. | |
| 2013/0330926 A1 | 12/2013 | Chandrashekar et al. | |
| 2014/0017891 A1 | 1/2014 | Chandrashekar et al. | |
| 2014/0120727 A1 | 5/2014 | Subramanian et al. | |
| 2014/0231896 A1 | 8/2014 | Matsumori et al. | |
| 2014/0273451 A1 | 9/2014 | Wang et al. | |
| 2014/0349477 A1 | 11/2014 | Chandrashekar et al. | |
| 2015/0024592 A1 | 1/2015 | Chandrashekar et al. | |
| 2015/0056803 A1 | 2/2015 | Chandrashekar et al. | |
| 2015/0111374 A1 | 4/2015 | Bao et al. | |
| 2015/0170935 A1 | 6/2015 | Wang et al. | |
| 2015/0214474 A1 | 7/2015 | Nishimura et al. | |
| 2015/0262829 A1 | 9/2015 | Park et al. | |
| 2015/0270140 A1 | 9/2015 | Gupta et al. | |
| 2016/0020152 A1* | 1/2016 | Possemé | H01L 21/31138 438/696 |
| 2016/0190008 A1 | 6/2016 | Chandrashekar et al. | |
| 2016/0203995 A1 | 7/2016 | Kanarik et al. | |
| 2016/0293467 A1 | 10/2016 | Caveney et al. | |
| 2016/0308112 A1 | 10/2016 | Tan et al. | |
| 2016/0314985 A1 | 10/2016 | Yang et al. | |
| 2017/0053810 A1 | 2/2017 | Yang et al. | |
| 2017/0053811 A1 | 2/2017 | Fung et al. | |
| 2017/0069462 A1 | 3/2017 | Kanarik et al. | |
| 2017/0117159 A1 | 4/2017 | Kanarik et al. | |
| 2017/0229311 A1 | 8/2017 | Tan et al. | |
| 2017/0278749 A1 | 9/2017 | Chandrashekar et al. | |

FOREIGN PATENT DOCUMENTS

| | | |
|---|---|---|
| CN | 103125013 A | 5/2013 |
| EP | 1 055 746 | 11/2000 |
| JP | H2-187031 A | 7/1990 |
| JP | H04-56130 | 2/1992 |
| JP | H4-142061 A | 5/1992 |
| JP | H5-226280 A | 9/1993 |
| JP | H07-094488 | 4/1995 |
| JP | H7-147321 A | 6/1995 |
| JP | H07-226393 | 8/1995 |
| JP | 09-022896 A | 1/1997 |
| JP | H09-326436 | 12/1997 |
| JP | H10-178014 A | 6/1998 |
| JP | 2001-007048 | 1/2001 |
| JP | 2001-274114 | 10/2001 |
| JP | 2002-009017 | 1/2002 |
| JP | 2002-016066 A | 1/2002 |
| JP | 2002-305162 | 10/2002 |
| JP | 2003-007677 | 1/2003 |
| JP | 2003-142484 | 5/2003 |
| JP | 2006-278496 | 10/2006 |
| JP | 2007-251164 | 9/2007 |
| JP | 2008-000742 | 1/2008 |
| JP | 2008-57042 | 3/2008 |
| JP | 2008-177577 | 7/2008 |
| JP | 2010-225697 | 10/2010 |
| JP | 2010-251760 A | 11/2010 |
| JP | 2011-035366 A | 2/2011 |
| JP | 5416280 B2 | 11/2013 |
| KR | 10-2001-0030488 | 4/2001 |
| KR | 10-2003-0035877 | 5/2003 |
| KR | 10-2003-0058853 | 7/2003 |
| KR | 10-2004-0087406 | 10/2004 |
| KR | 10-2005-0011479 | 1/2005 |
| KR | 10-2005-0013187 | 2/2005 |
| KR | 10-2006-0087844 | 8/2006 |
| KR | 10-2007-0054100 | 5/2007 |
| KR | 10-2010-0067065 | 6/2010 |
| KR | 10-1201074 B1 | 11/2012 |
| TW | 557503 | 10/2003 |
| WO | WO 99/67056 | 12/1999 |
| WO | WO 02/091461 A2 | 11/2002 |
| WO | WO 2011/081921 A2 | 7/2011 |
| WO | WO 2012/091461 A2 | 7/2012 |
| WO | WO 2013/148444 | 10/2013 |
| WO | WO 2013/148880 | 10/2013 |
| WO | WO 2016/100873 | 6/2016 |

OTHER PUBLICATIONS

Faraz et al. ("Atomic Layer Etching: What Can We Learn from Atomic Layer Deposition," ECS Journal of Solid State Science and Technology, 4 (6) N5023-5032, published Mar. 24, 2015).*

U.S. Appl. No. 14/749,285, filed Jun. 24, 2015, entitled "Cobalt Etch Back."

U.S. Appl. No. 14/749,291, filed Jun. 24, 2015, entitled "Dry Plasma Etch Method to Pattern MRAM Stack."

U.S. Appl. No. 14/325,190, filed Jul. 7, 2014, entitled "Method to Etch Non-Volatile Metal Materials."

U.S. Appl. No. 14/696,254, filed Apr. 24, 2015, entitled "Integrating Atomic Scale Processes: ALD (Atomic Layer Deposition) and ALE (Atomic Layer Etch)."

Kanarik et al. (Mar./Apr. 2015) "Overview of atomic layer etching in the semiconductor industry," *J. Vac. Sci. Technol. A* 33(2):020802-1-020802-14.

U.S. Notice of Allowance dated Mar. 18, 2015 issued in U.S. Appl. No. 14/285,505.

U.S. Notice of Allowance dated May 14, 2015 issued in U.S. Appl. No. 14/285,505.

U.S. Office Action dated Dec. 30, 2009 issued in U.S. Appl. No. 12/332,017.

U.S. Final Office Action dated Jul. 26, 2010 issued in U.S. Appl. No. 12/332,017.

U.S. Office Action dated Nov. 15, 2010 issued in U.S. Appl. No. 12/332,017.

U.S. Final Office Action dated Jul. 22, 2011 issued in U.S. Appl. No. 12/332,017.

U.S. Notice of Allowance dated Oct. 28, 2011 issued in U.S. Appl. No. 12/332,017.

U.S. Office Action dated Nov. 1, 2010 issued in U.S. Appl. No. 12/535,377.

U.S. Office Action dated Jun. 14, 2011 issued in U.S. Appl. No. 12/535,377.

U.S. Final Office Action dated Dec. 1, 2011 issued in U.S. Appl. No. 12/535,377.

U.S. Office Action dated Mar. 7, 2013 issued in U.S. Appl. No. 12/535,377.

U.S. Final Office Action dated Oct. 7, 2013 issued in U.S. Appl. No. 12/535,377.

U.S. Examiner's Answer to Appeal Brief dated Apr. 17, 2015 issued in U.S. Appl. No. 12/535,377.

U.S. Office Action dated Nov. 23, 2012 issued in U.S. Appl. No. 13/412,534.

(56) References Cited

OTHER PUBLICATIONS

U.S. Notice of Allowance dated Apr. 8, 2013, issued in U.S. Appl. No. 13/412,534.
U.S. Office Action dated Apr. 11, 2014 issued in U.S. Appl. No. 13/934,089.
U.S. Office Action dated Nov. 12, 2014 issued in U.S. Appl. No. 13/934,089.
U.S. Office Action dated Sep. 13, 2010 issued in U.S. Appl. No. 12/535,464.
U.S. Final Office Action dated Apr. 14, 2011 issued in U.S. Appl. No. 12/535,464.
U.S. Office Action dated Jul. 28, 2011 issued in U.S. Appl. No. 12/535,464.
U.S. Office Action dated Oct. 12, 2011 issued in U.S. Appl. No. 12/535,464.
U.S. Notice of Allowance dated Dec. 30, 2011 issued in U.S. Appl. No. 12/535,464.
U.S. Office Action dated Sep. 2, 2011 issued in U.S. Appl. No. 12/534,566.
U.S. Notice of Allowance dated Dec. 20, 2011 issued in U.S. Appl. No. 12/534,566.
U.S. Office Action dated Mar. 13, 2012 issued in U.S. Appl. No. 12/833,823.
U.S. Final Office Action dated Dec. 21, 2012 issued in U.S. Appl. No. 12/833,823.
U.S. Office Action dated Sep. 9, 2013 issued in U.S. Appl. No. 12/833,823.
U.S. Final Office Action dated Apr. 1, 2014 issued in U.S. Appl. No. 12/833,823.
U.S. Notice of Allowance dated Jan. 14, 2015 issued in U.S. Appl. No. 12/833,823.
U.S. Office Action dated Nov. 25, 2011 issued in U.S. Appl. No. 13/016,656.
U.S. Notice of Allowance dated Jan. 9, 2012 issued in U.S. Appl. No. 13/016,656.
U.S. Office Action dated Mar. 27, 2012 issued in U.S. Appl. No. 13/351,970.
U.S. Final Office Action dated Sep. 11, 2012 issued in U.S. Appl. No. 13/351,970.
U.S. Notice of Allowance dated Jan. 9, 2013 issued in U.S. Appl. No. 13/351,970.
U.S. Office Action dated Jan. 6, 2014 issued in U.S. Appl. No. 13/888,077.
U.S. Notice of Allowance, dated May 12, 2014 issued in U.S. Appl. No. 13/888,077.
U.S. Office Action, dated Jan. 15, 2015, issued in U.S. Appl. No. 13/774,350.
U.S. Office Action, dated Dec. 23, 2014, issued in U.S. Appl. No. 13/851,885.
U.S. Office Action dated Dec. 18, 2014 issued in U.S. Appl. No. 14/502,817.
JP Office Action dated Mar. 11, 2014 issued in Japanese Application No. 2009-278990.
JP Final Office Action dated Mar. 17, 2015 issued in Japanese Application No. 2009-278990.
KR Office Action dated Aug. 8, 2011 issued in Korean Application No. 10-2009-0122292.
KR Office Action dated Jun. 26, 2012 issued in Korean Application No. 10-2009-0122292.
KR Office Action dated Nov. 6, 2012, issued in Korean Application No. 2012-0104518.
TW Office Action dated Mar. 27, 2014, issued in Taiwan Application No. 098142115.
TW Office Action (Decision) dated Oct. 13, 2014, issued in Taiwan Application No. 098142115.
JP Office Action dated Feb. 25, 2014 issued in Japanese Application No. 2009-292610.
JP Office Action dated Feb. 10, 2015 issued in Japanese Application No. 2009-292610.
KR Office Action dated Sep. 12, 2012 issued in Korean Application No. 2012-0104518.
TW Office Action dated Apr. 29, 2014, issued in Taiwan Application No. 098146010.
SG Examination and Search Report dated Dec. 14, 2011 issued in Singapore Application No. 201005237-1.
KR Provisional Rejection dated Nov. 16, 2012, issued in Korean Application No. 2011-0068603.
PCT International Search Report and Written Opinion, dated Jun. 28, 2013, issued in PCT/US2013/033174.
PCT International Preliminary Report on Patentability and Written Opinion, dated Oct. 9, 2014, issued in PCT/US2013/033174.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Chen et al., (Aug. 2003) "Advances in Remote Plasma Sources for Cleaning 300 mm and Flat Panel CVD Systems," *Semiconductor Magazine*, 6 pp.
Deposition Process, Oxford Electronics, 1996, 1 page.
Dimensions of Wafer as described by Wikepedia, 2008, 1 page.
Rosner et al., (1971) "Kinetics of the attack of refractory solids by atomic and molecular fluorine," *The Journal of Physical Chemistry*, 75(3):308-317.
Tsang, C.K. et al., "CMOS-Compatible Through Silicon Vias for 3D Process Integration", Materials Research Society 2007 Symposium Proceedings vol. 970, paper 0970-Y01-01.
U.S. Patent Application entitled, "Pulsing RF Power in Etch Process to Enhance Tungsten Gapfill Performance," U.S. Appl. No. 15/240,807, filed Aug. 18, 2016.
U.S. Office Action dated Sep. 16, 2015 issued in U.S. Appl. No. 14/341,646.
U.S. Office Action dated Apr. 8, 2016 issued in U.S. Appl. No. 14/341,646.
U.S. Notice of Allowance dated Sep. 9, 2016 issued in U.S. Appl. No. 14/341,646.
U.S. Office Action dated Oct. 9, 2015 issued in U.S. Appl. No. 12/535,377.
U.S. Final Office Action dated May 5, 2016 issued in U.S. Appl. No. 12/535,377.
U.S. Office Action dated Jul. 8, 2015 issued in U.S. Appl. No. 13/934,089.
U.S. Final Office Action dated Dec. 31, 2015 issued in U.S. Appl. No. 13/934,089.
U.S. Office Action dated Jun. 1, 2016 issued in U.S. Appl. No. 13/934,089.
U.S. Notice of Allowance dated Oct. 21, 2016 issued in U.S. Appl. No. 13/934,089.
U.S. Office Action, dated Oct. 8, 2015, issued in U.S. Appl. No. 13/774,350.
U.S. Office Action, dated Jun. 2, 2016, issued in U.S. Appl. No. 13/774,350.
U.S. Notice of Allowance, dated Aug. 3, 2016, issued in U.S. Appl. No. 13/851,885.
U.S. Final Office Action dated Jul. 17, 2015 issued in U.S. Appl. No. 14/502,817.
U.S. Notice of Allowance dated Sep. 25, 2015 issued in U.S. Appl. No. 14/502,817.
U.S. Office Action dated Sep. 2, 2016 issued in U.S. Appl. No. 14/965,806.
Japanese Office Action (Examiner's Report to the Appeal Board of the Japan Office) dated Sep. 1, 2015 issued in Application No. JP 2009-292610.
Singapore Written Examination Report and Search Report dated Jun. 30, 2015 issued in Application No. SG 201303450-9.
Singapore Search and Examination Report dated Jan. 26, 2016 issued in Application No. SG 201303450-9.
Korean Office Action [no translation] dated Sep. 26, 2016, issued in Application No. KR 10-2013-0054726.
Chinese First Office Action dated Feb. 26, 2016, issued in Application No. CN 201380022648.2.
Chinese First Office Action dated Mar. 18, 2016 issued in Application No. CN 201380022693.8.

(56) References Cited

OTHER PUBLICATIONS

U.S. Patent Application entitled, "Atomic Layer Etching of Tungsten and Other Metals," U.S. Appl. No. 15/239,138, filed Aug. 17, 2016.
U.S. Office Action dated May 5, 2016 issued in U.S. Appl. No. 14/749,285.
U.S. Final Office Action dated Sep. 23, 2016 issued in U.S. Appl. No. 14/749,285.
Lee et al. (2015) "Atomic Layer Etching of $Al_2O_3$ Using Sequential, Self-Limiting Thermal Reactions with $Sn(acac)_2$ and Hydrogen Fluoride," *ACSNANO*,9(2):2061-2070.
Wolf, S. and Tauber, R.N. (1986) "Silicon Processing for the VLSI Era," *Volume 1—Process Technology, Lattice Press*, pp. 542-557.
U.S. Final Office Action, dated Jan. 18, 2017, issued in U.S. Appl. No. 13/774,350.
U.S. Notice of Allowance, dated Dec. 14, 2016, issued in U.S. Appl. No. 13/851,885.
U.S. Notice of Allowance, dated Mar. 24, 2017, issued in U.S. Appl. No. 13/851,885.
U.S. Final Office Action dated Apr. 14, 2017 issued in U.S. Appl. No. 14/965,806.
U.S. Office Action dated Feb. 17, 2017 issued in U.S. Appl. No. 14/749,285.
U.S. Final Office Action dated Mar. 30, 2017 issued in U.S. Appl. No. 14/749,285.
U.S. Office Action dated Nov. 28, 2016 issued in U.S. Appl. No. 14/749,291.
Taiwan Office Action after Re-examination dated Mar. 14, 2017 issued in Application No. TW 098142115.
Japanese Appeal Decision dated Nov. 1, 2016 issued in Application No. JP 2009-292610.
Japanese Office Action dated Jan. 24, 2017, issued in JP 2015-514160.
Taiwan Office Action and Search Report dated Nov. 22, 2016 issued in Application No. TW 102110937.
Chinese Second Office Action dated Jan. 23, 2017 issued in Application No. CN 201380022693.8.
Japanese Notification of Reasons for Rejection dated Dec. 20, 2016 issued in Application No. JP 2015-503547.
Taiwan Office Action dated Oct. 25, 2016 issued in Application No. TW 102110947.
Kanarik et al. (2017) "Predicting synergy in atomic layer etching," J. Vac. Sci. Technol. A,35(5):05C302-1 through 05C302-7.
U.S. Appl. No. 15/286,421, filed Oct. 5, 2016, Tan et al.
U.S. Office Action dated Mar. 24, 2017 issued in U.S. Appl. No. 15/286,421.
U.S. Office Action dated Aug. 11, 2017 issued in U.S. Appl. No. 14/749,285.
U.S. Notice of Allowance dated Sep. 29, 2017 issued in U.S. Appl. No. 14/749,285.
U.S. Notice of Allowance dated Jun. 30, 2017 issued in U.S. Appl. No. 14/749,291.
U.S. Office Action dated Aug. 25, 2017 issued in U.S. Appl. No. 15/239,138.
U.S. Office Action dated Apr. 13, 2017 issued in U.S. Appl. No. 15/240,807.
U.S. Final Office Action dated Aug. 31, 2017 issued in U.S. Appl. No. 15/240,807.
U.S. Office Action, dated Sep. 11, 2017, issued in U.S. Appl. No. 14/965,806.
Taiwan Office Action dated Nov. 7, 2017 issued in Application No. TW 103125515.
Korean Office Action dated Sep. 26, 2016, issued in Application No. KR 10-2013-0054726.
Korean Final Office Action dated May 30, 2017, issued in Application No. KR 10-2013-0054726.
Korean Final Office Action dated Sep. 19, 2017, issued in Application No. KR 10-2013-0054726.
Chinese Third Office Action dated Sep. 25, 2017 issued in Application No. CN 201380022693.8.
U.S. Appl. No. 15/719,497, filed Sep. 28, 2017, Tan et al.
U.S. Appl. No. 15/687,775, filed Aug. 28, 2017, Chandrashekar et al.
U.S. Notice of Allowance dated Sep. 28, 2017 issued in U.S. Appl. No. 15/286,421.
U.S. Notice of Allowance [Supplemental Notice of Allowability] dated Oct. 26, 2017 issued in U.S. Appl. No. 15/286,421.
U.S. Office Action dated Jun. 17, 2016 issued in U.S. Appl. No. 14/696,254.
U.S. Notice of Allowance dated Oct. 14, 2016 issued in U.S. Appl. No. 14/696,254.
U.S. Notice of Allowance dated Jun. 29, 2017 issued in U.S. Appl. No. 15/400,368.
U.S. Notice of Allowance [Supplemental Notice of Allowability] dated Sep. 29, 2017 issued in U.S. Appl. No. 14/749,285.
U.S. Office Action dated Nov. 29, 2017 issued in U.S. Appl. No. 15/421,189.
PCT International Search Report and Written Opinion dated Feb. 25, 2016 issued in PCT/US2015/066789.
Chinese First Office Action dated Dec. 27, 2017 issued in CN 201610017911.4.
U.S. Office Action, dated Dec. 12, 2017, issued in U.S. Appl. No. 15/482,271.
U.S. Appl. No. 15/719,484, filed Sep. 28, 2017, Kanarik et al.
U.S. Appl. No. 15/824,987, filed Nov. 28, 2017, Yang et al.
U.S. Appl. No. 15/841,205, filed Dec. 13, 2017, Kanarik.

* cited by examiner

ATOMIC LAYER ETCHING OF TUNGSTEN FOR ENHANCED TUNGSTEN DEPOSITION FILL

CROSS-REFERENCE TO RELATED APPLICATION

This application claims benefit of U.S. Provisional Patent Application No. 62/202,670, filed Aug. 7, 2015, and titled "ATOMIC LAYER ETCHING OF TUNGSTEN FOR ENHANCED TUNGSTEN DEPOSITION FILL," which is incorporated by reference herein in its entirety and for all purposes.

BACKGROUND

Semiconductor fabrication processes often involve deposition of metals, such as tungsten, into features, such as vias or trenches, to form contacts or interconnects. However, as devices shrink, features become smaller and harder to fill, particularly in advanced logic and memory applications.

SUMMARY

Provided herein are methods of filling features on substrates. One aspect involves a method of filling features on a substrate by (a) depositing a first amount of a metal in a feature; and (b) directionally etching the metal at or near an opening of the feature relative to an interior region of the feature by (i) modifying the surface of the deposited metal by exposing the metal to a halogen-containing gas; and (ii) exposing the modified surface to an activation gas to selectively etch the metal. The method may further include repeating (a) and (b).

In various embodiments, the metal contains one of titanium, tantalum, nickel, cobalt, or molybdenum. In some embodiments, the metal contains tungsten.

In some embodiments, the halogen-containing gas is selected from the group consisting of chlorine, bromine, iodine, sulfur hexafluoride, silicon tetrafluoride, boron trichloride, or combinations thereof. In some embodiments, the activation gas is an inert gas, such as neon, krypton, argon, or combinations thereof.

The method may further include applying a bias during at least one of (i) and (ii). The bias power may be less than a threshold bias power. The bias power may be less than about 80 Vb.

In various embodiments, (b) includes a self-limiting reaction. In some embodiments, the substrate includes features having different size openings. The feature may have an aspect ratio of at least 3:1. In some embodiments, the opening is less than 20 nm wide.

In some embodiments, (a) and (b) are performed without breaking vacuum. In some embodiments, (a) and (b) are performed in the same chamber. In some embodiments, (a) and (b) are performed in different chambers of the same tool.

The method may further include igniting a plasma during at least one of (i) and (ii). The plasma power may be between about 0 W and about 1000 W.

Another aspect may involve a method including (a) partially filling a feature with tungsten; (b) directionally etching tungsten at or near the opening of the feature by exposing the substrate to alternating pulses of a halogen-containing gas and an activation gas; and (c) filling the feature with tungsten.

In some embodiments, a bias is applied during (b). In some embodiments, the bias is applied during (b) at a threshold bias power.

In various embodiments, (a) and (b) are performed without breaking vacuum. In some embodiments, (a) and (b) are performed in the same chamber. The method may further include repeating (a) and (b). Filling the feature may include repeating (a) and (b).

The tungsten may be deposited by CVD. In some embodiments, the tungsten is deposited by ALD. The tungsten may be deposited by exposing the substrate to alternating pulses of a tungsten-containing precursor and a reducing agent. The tungsten may be deposited using a chlorine-containing tungsten precursor. In some embodiments, the tungsten is fluorine-free tungsten.

Another aspect involves an apparatus for processing semiconductor substrates, the apparatus including: a process chamber including a showerhead and a substrate support, a plasma generator, and a controller having at least one processor and a memory, whereby the at least one processor and the memory are communicatively connected with one another, the at least one processor is at least operatively connected with the flow-control hardware, and the memory stores machine-readable instructions for: introducing a tungsten-containing precursor and a reducing agent to the chamber to deposit tungsten on a substrate; introducing a halogen-containing gas to modify the surface of the tungsten; and introducing an activation gas and igniting a plasma to etch at least part of the modified surface of tungsten.

The substrate support may include a bias, and the memory may further store machine-readable instructions for setting the bias power less than about 80 Vb during (iii). In some embodiments, the memory further stores machine-readable instructions for igniting a plasma during (ii).

In some embodiments, the memory further stores machine-readable instructions for repeating (ii) and (iii) in cycles. In some embodiments, the memory further stores machine-readable instructions for after performing (ii) and (iii), repeating (i).

These and other aspects are described further below with reference to the drawings.

DETAILED DESCRIPTION

Figure 1:
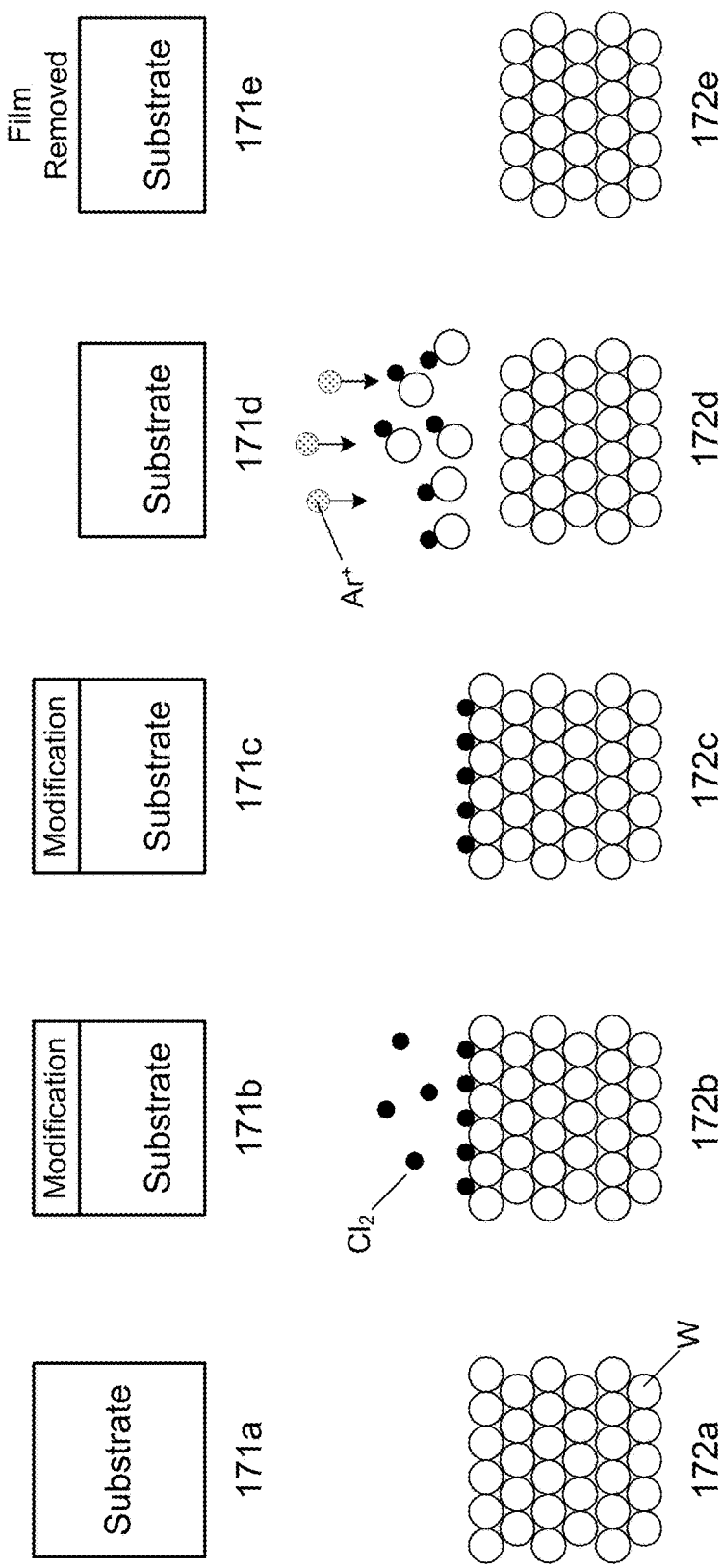
FIG. 1 is a schematic illustration of an example of atomic layer etching of film on a substrate.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes often involve deposition of metals into features, such as vias or trenches, to form contacts or interconnects. Tungsten is often deposited into such features using chemical vapor deposition (CVD), whereby a substrate including features to be filled is exposed to a tungsten-containing precursor and a reducing agent to deposit the tungsten into the features. However, as devices shrink, features become smaller and harder to fill by CVD, particularly in advanced logic and memory applications. For example, features may have a high aspect ratio, such as at least about 3:1. Some features may have a small opening of less than about 20 nm. Some features may also include a re-entrant feature profile, which is further described below with respect to FIG. 2. For features in advanced technology nodes, the deposition rate at or near the opening of the feature may be faster than deposition at the bottom of the feature, which causes the opening to close before the entire feature is filled, leaving behind a void or gap in the feature. The presence of such gaps may be detrimental to the performance and reliability of the semiconductor device, and ultimately the semiconductor product.

Additionally, some substrates may include features of various sizes. As a result, features are filled or the openings of the features are closed more quickly in smaller features than in larger features, and larger features may not be completely filled. The small opening and high aspect ratio of features may also cause non-conformal deposition of tungsten within a feature. Additionally, in re-entrant feature profiles caused by conventional deposition techniques and possible overhang of an underlying barrier or glue layer due to non-conformal coverage on the feature, the feature may have a net re-entrant sidewall profile, which makes complete fill of the feature challenging.

One method of depositing tungsten into features having small openings includes exposing a partially filled feature to a reactive species such as a fluorine-containing species generated in a remote plasma generator and operating in a mass transfer limited process regime to remove previously deposited tungsten at the opening of the feature and thereby open the feature to allow further deposition of tungsten into the feature, thereby facilitating complete void-free fill. However, while such methods may be effective in depositing void-free tungsten into small features, the amount of deposition and etch processes used to fill a larger feature may vary. Additionally, fluorine-containing reactive species are very reactive and therefore etch tungsten quickly, such that etch conditions are modulated to prevent from etching too much tungsten. If the entirety of the deposited tungsten is removed, it becomes difficult to subsequently re-nucleate the exposed surface with tungsten to fill the feature. For example, prior to depositing any tungsten, a feature is often lined with a barrier layer, such as a titanium nitride barrier layer, and the feature may be exposed to precursors to deposit a tungsten nucleation layer by methods such as atomic layer deposition (ALD). However, if a fluorine-containing reactive species removes the entire nucleation layer due to its high reactivity and etch rate, the titanium nitride barrier layer is exposed and tungsten is nucleated on the surface a second time, thereby reducing throughput. In some embodiments, the fluorine-containing reactive species may etch at least some of or the entire barrier layer, which may cause a second tungsten deposition to be incomplete as some of the tungsten nucleation layer may be missing on the substrate.

Provided herein are methods of filling features with tungsten using an integrated deposition and atomic layer etching (ALE) process. ALE is a technique that removes thin layers of material using sequential self-limiting reactions. Generally, ALE may be performed using any suitable technique. Examples of atomic layer etching techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etching techniques. In various embodiments, ALE may be performed with plasma, or may be performed thermally. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas, which may be in a plasma, (ii) purging of the reactant gas from the chamber, (iii) delivery of a removal gas and an optional plasma, and (iv) purging of the chamber. In some embodiments, etching may be performed nonconformally on a substrate, such as a substrate with topography and/or features.

FIG. 1 shows two example schematic illustrations of an ALE cycle. Diagrams 171a-171e show a generic ALE cycle. In 171a, a substrate is provided. In 171b, the surface of the substrate is modified. In 171c, the chemical used to modify the substrate is purged. In 171d, the modified layer is being etched. In 171e, the modified layer is removed. Similarly, diagrams 172a-172e show an example of an ALE cycle for etching a tungsten film. In 172a, a tungsten substrate is provided, which includes many tungsten atoms. In 172b, reactant gas chlorine is introduced to the substrate, which modifies the surface of the substrate. In some embodiments, a chlorine reactant may also be delivered as atomic chlorine in a plasma which may not cause direct etching of a tungsten substrate. The schematic in 172b shows that some chlorine is adsorbed onto the surface of the substrate as an example. Although chlorine ($Cl_2$) is depicted in FIG. 1, any chlorine-containing compound or other suitable reactant may be used. In 172c, the reactant gas chlorine is purged from the chamber. In 172d, a removal gas argon is introduced with a directional plasma, as indicated by the $Ar^+$ plasma species and arrows, to remove the modified surface of the substrate. The activated etching involves the use of inert ions (e.g., $Ar^+$) operating with energy below the sputtering threshold to energize the adsorb species (e.g., Cl species) to etch away the substrate one monolayer at a time. During this operation, a bias is applied to the substrate to attract ions toward it. In 172e, the chamber is purged and the byproducts are removed.

The etch rate for ALE processes is lower than that of a fluorine-based remote plasma etch, but ALE etches more uniformly due to the self-limiting nature of the surface reactions. Thus, ALE processes provide more control over the etching operations, particularly in larger features, such that the amount of material removed in each cycle is limited and not etched too quickly so as to prevent completely etching of material from the surface of the feature. Deposition processes described herein may be controlled by toggling pressure of the chamber and temperature of the substrate, both of which affect adsorption of a modification chemistry during ALE. Processes may also be controlled by modulating a substrate bias during one or more operations performed in ALE and modulating modification chemistry flow and chemistry. Deposition processes may also depend on the chemistry of the metal to be deposited into features.

Figure 2:
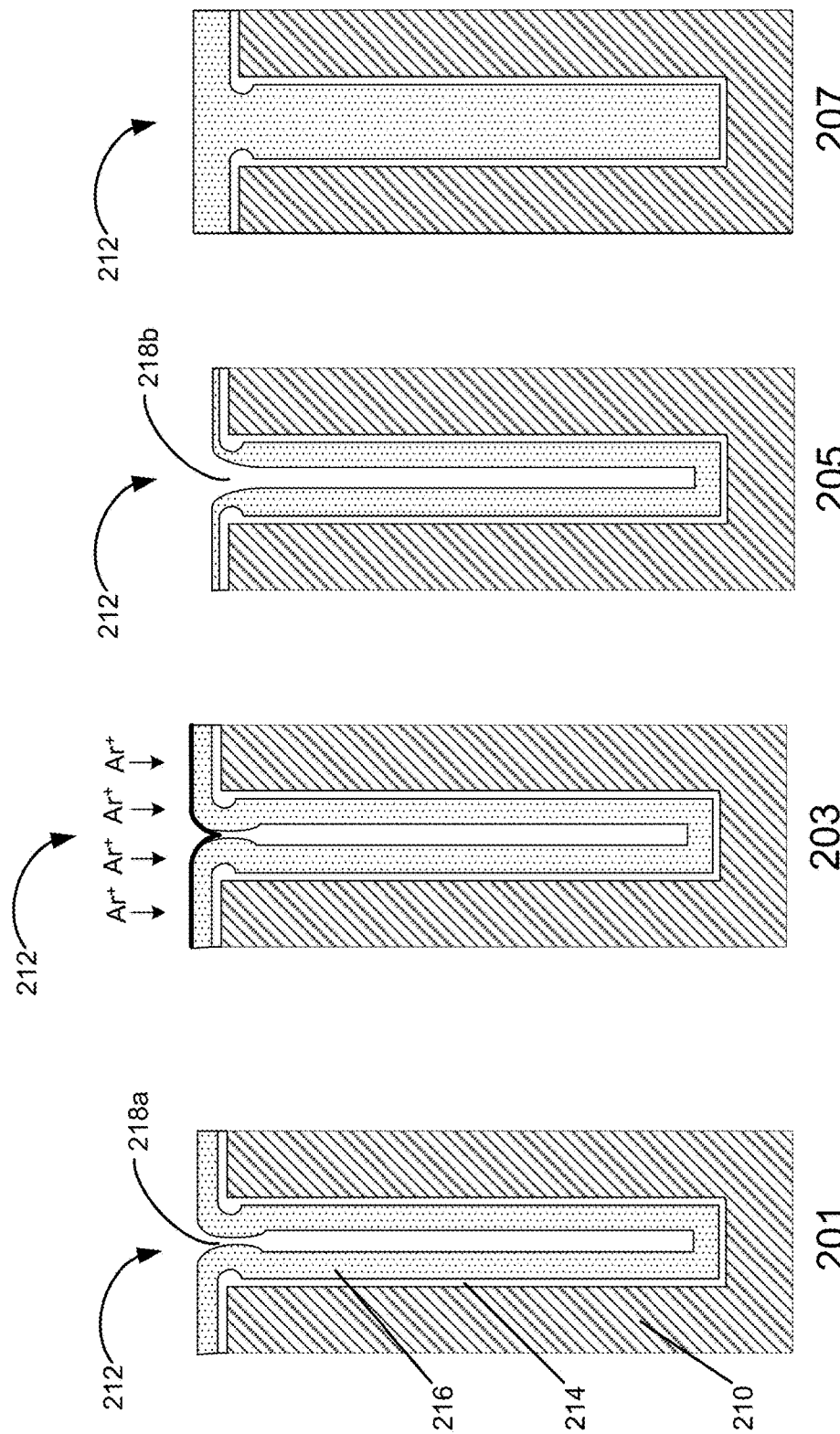
FIG. 2 is a schematic illustration of a feature undergoing operations of certain disclosed embodiments.

Disclosed embodiments may involve deposition of a metal, such as tungsten, in a feature by any suitable method, including ALD, CVD, plasma enhanced ALD (PEALD), plasma enhanced CVD (PECVD), or physical vapor deposition (PVD); adsorption of a halogen-containing gas and optional exposure to a plasma to modify a surface of the deposited metal; exposure to an activation gas to remove the modified surface; and further deposition of the metal to fill the feature. FIG. 2 provides an example schematic illustration of a feature undergoing various operations in accordance with disclosed embodiments. In 201, a substrate 210 is shown with a feature 212, which includes a TiN barrier layer 214 deposited conformally in the feature and tungsten 216 conformally deposited by ALD over the TiN barrier layer 214. In 203, after the feature 212 is exposed to a halogen-containing gas to modify the surface of the deposited tungsten 216, the feature 212 is exposed to an activation gas, such as a gas including argon ions or neon, or krypton, which may etch the tungsten 216 at or near the opening 218a of the feature 212 directionally, such as by using a low bias. In 205, the feature 212 has been opened, leaving a feature opening 218b. In 207, the feature 212 is subsequently filled with tungsten by CVD to yield a void-free tungsten filled feature.

Figure 3:
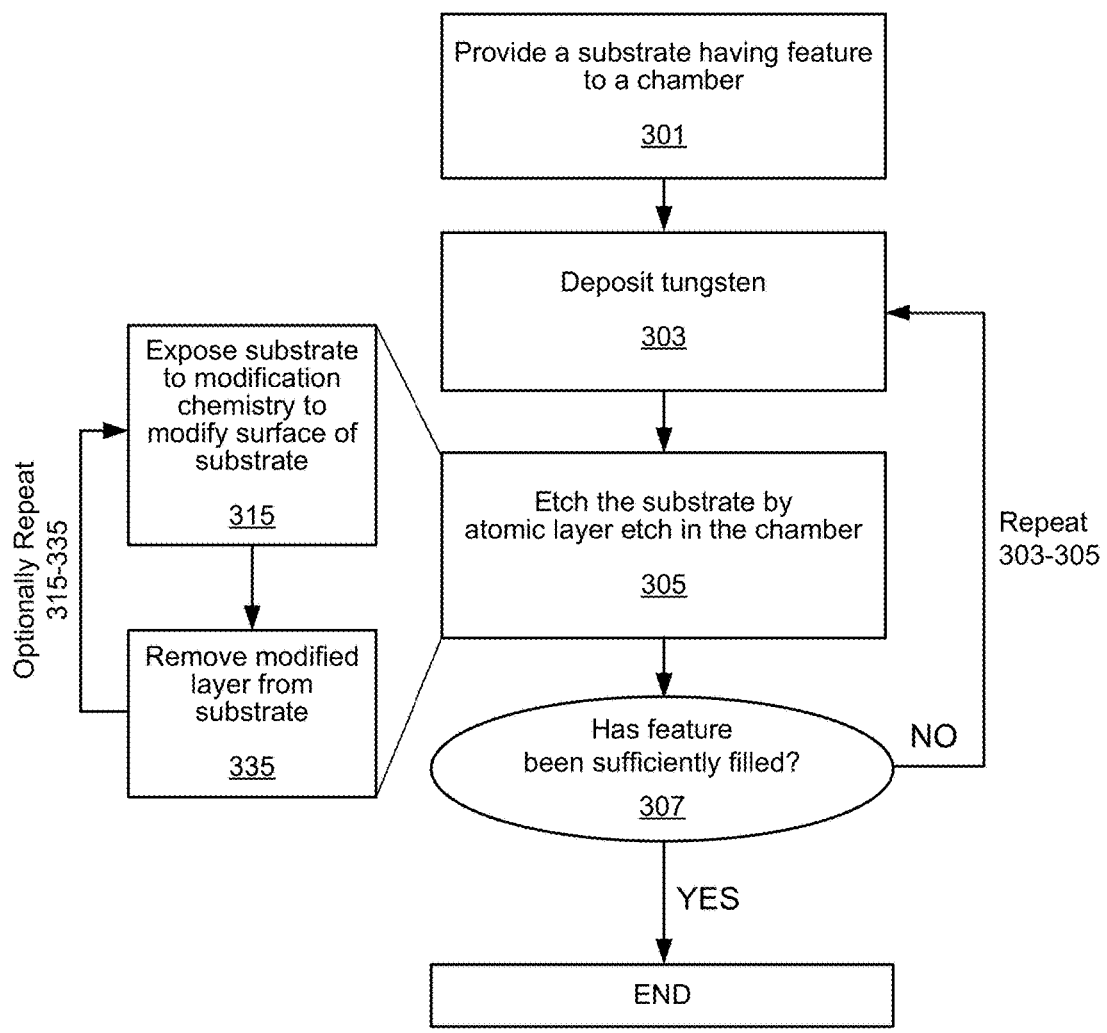
FIG. 3 is a process flow diagram depicting operations performed in accordance with certain disclosed embodiments.

FIG. 3 provides a process flow diagram depicting operations in a method in accordance with disclosed embodiments. While the description below focuses on tungsten feature fill, aspects of the disclosure may also be implemented in filling features with other materials. For example, feature fill using one or more techniques described herein may be used to fill features with other materials including other tungsten-containing materials (e.g., tungsten nitride (WN) and tungsten carbide (WC)), titanium-containing materials (e.g., titanium (Ti), titanium nitride (TiN), titanium silicide (TiSi), titanium carbide (TiC), and titanium aluminide (TiAl)), tantalum-containing materials (e.g., tantalum (Ta), and tantalum nitride (TaN)), molybdenum-containing materials, cobalt-containing materials, and nickel-containing materials (e.g., nickel (Ni) and nickel silicide (NiSi)). In various embodiments, features may be filled with another metal instead of or in combination with tungsten. For example, cobalt or molybdenum may be used to fill features.

In operation 301 of FIG. 3, a substrate is provided to a chamber. The substrate may be a silicon wafer, e.g., a 200-mm wafer, a 300-mm wafer, or a 450-mm wafer, including wafers having one or more layers of material such as dielectric, conducting, or semi-conducting material deposited thereon. A patterned substrate may have "features" such as vias or contact holes, which may be characterized by one or more of narrow and/or re-entrant openings, constrictions within the features, and high aspect ratios. The features may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

Examples of applications include logic and memory contact fill, DRAM buried wordline fill, vertically integrated memory gate/wordline fill, and 3-D integration with through-silicon vias (TSVs). The methods described herein can be used to fill vertical features, such as in tungsten vias, and horizontal features, such as vertical NAND (VNAND) wordlines.

In various embodiments, types of substrates fabricated from performing disclosed embodiments may depend on the aspect ratios of features on the substrate prior to performing disclosed embodiments. In some embodiments, features on a substrate provided in operation 301 may have an aspect ratio of at least about 2:1, at least about 3:1, at least about 4:1, at least about 6:1, at least about 10:1, or higher. The feature may also have a dimension near the opening, e.g., an opening diameter or line width of between about 5 nm to 500 nm, for example between about 25 nm and about 300 nm. Disclosed methods may be performed on substrates with features having an opening less than about 20 nm. A "small" feature may be defined as a feature having an opening diameter or line width less than that of a "large" feature in relative terms. Large features may have an opening diameter or a critical dimension at least 1.5 times, or at least 2 times, or at least 5 times, or at least 10 times or more than 10 times larger than the critical dimension of small features. Examples of "small" features include features having an opening diameter between about 1 nm and about 2 nm. Examples of "large" features include features having an opening diameter on the order of hundreds of nanometers to about 1 micron.

A via, trench or other recessed feature may be referred to as an unfilled feature or a feature. According to various embodiments, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the middle and/or bottom of the feature.

In operation 303, tungsten is deposited over the substrate such as by exposing the substrate to a tungsten-containing precursor and a reducing agent to partially fill a feature on the substrate. Example tungsten-containing precursors include tungsten-containing halide precursors, which may include tungsten fluorides such as $WF_6$; and tungsten chlorides such as $WCl_6$, $W(CO)_6$, and $WCl_5$. In some embodiments, metal-organic tungsten-containing precursors may be used. Example reducing agents include hydrogen, boranes (such as $B_2H_6$), silanes (such as $SiH_4$), and germanes (such as $GeH_4$).

In some embodiments, tungsten is deposited conformally. In some implementations, operation 303 involves deposition of a tungsten nucleation layer, followed by bulk deposition. Any suitable method for depositing tungsten may be used, such as ALD, CVD, PECVD, PEALD, or PVD. For the example provided herein, tungsten may be deposited conformally into a feature by ALD. For example, in some embodiments, a tungsten nucleation layer is deposited by sequentially pulsing a tungsten-containing precursor and one or more reducing agents to form a tungsten nucleation layer by an ALD or pulsed nucleation layer (PNL) process. In some implementations, operation 303 may involve only bulk deposition and no nucleation layer deposition, if, for example, the feature includes an under-layer that supports tungsten deposition. Bulk deposition may be deposited by chemical vapor deposition and is described further below.

In features that include constrictions or are otherwise susceptible to pinch-off, operation 303 can be performed at least until the feature is pinched off. Features having different sizes may pinch off at different times. In conformal deposition, deposition starts from each surface and progresses with growth generally orthogonal to the surface. Tungsten growth in features starts from each sidewall and progresses until the growth pinches off the feature. In some implementations, the amount of tungsten deposited operation 303 can be determined based on the narrowest feature dimension.

In various embodiments, operation 303 may be performed such that the opening of the feature is closed. In some embodiments, a seam may be formed at or near the opening of the feature. For the purposes of this description, "near the opening" is defined as an approximate position or an area within the feature (i.e., along the side wall of the feature) corresponding to between about 0-10% of the feature depth measured from the field region. In certain embodiments, the area near the opening corresponds to the area at the opening. Further, "inside the feature" or the "interior of the feature" is defined as an approximate position or an area within the feature corresponding to between about 20%-60% of the feature depth measured from the field region on the top of the feature. Typically, when values for certain parameters (e.g., thicknesses) are specified "near the opening" or "inside the feature", these values represent a measurement or an average of multiple measurements taken within these positions/areas.

In operation 305, the substrate is directionally or preferentially etched by atomic layer etching. "Directional" or "preferential" as used herein may be defined as etching more material at or near the top of the feature than in the rest of the feature, such as inside or interior of the feature. Atomic layer etching involves a surface modification and an activation operation. In some embodiments, a carrier gas, which may include $N_2$, Ar, Ne, He, and combinations thereof, is continuously flowed during operation 305. In some embodiments, a carrier gas is only used during a removal process during operation 305. The carrier gas may be used as a purge gas in some operations as described below. In some embodiments, another reactant gas, such as oxygen, is used during operation 305 to remove a modified layer. In some embodiments, a carrier gas is not flowed during removal.

In operation 315, the substrate is exposed to a modification chemistry to modify a surface of the substrate. The modification chemistry may be a gas or a plasma or reactive species. The modification operation forms a thin, reactive surface layer with a thickness that is more easily removed than un-modified material. The modification operation may be performed such that spontaneous etching of the substrate is prevented.

In a modification operation, a substrate may be modified using a halogen-containing chemistry. For example, a substrate may be chlorinated by introducing chlorine into the chamber. Chlorine is used as an example modification chemistry in disclosed embodiments, but it will be understood that in some embodiments, a different modification chemistry is introduced into the chamber. Examples include bromine, iodine, sulfur hexafluoride, silicon tetrafluoride, and boron trichloride ($BCl_3$). Additional examples of etching metals by ALE are further described in U.S. Patent Application No. 62/207,250, filed on Aug. 19, 2015, titled "ATOMIC LAYER ETCHING OF TUNGSTEN AND OTHER METALS", which is herein incorporated by reference in its entirety.

In various embodiments, a fluorine chemistry is not used to prevent chemical etching that may not be etched in monolayers. For example, nitrogen trifluoride ($NF_3$) can be highly reactive in a plasma and may spontaneously etch the substrate rather than etch the substrate conformally in layers. However, in some embodiments, a highly reactive halogen-containing chemistry such as ClF3 may be used to etch other materials, such as materials that are less susceptible to spontaneous etching.

The modification chemistry may be selected depending on the type and chemistry of the substrate to be etched. In some embodiments, chlorine may react with the substrate or may be adsorbed onto the surface of the substrate. In various embodiments, chlorine is introduced into the chamber in a gaseous form and may be optionally accompanied by a carrier gas which may be any of those described above.

In some embodiments, a chlorine-based plasma may be generated during this operation. The species generated from a chlorine-based plasma can be generated in situ by forming a plasma in the process chamber housing the substrate or they can be generated remotely in a process chamber that does not house the substrate such as a remote plasma generator, and can be supplied into the process chamber housing the substrate. In various embodiments, the plasma may be an inductively coupled plasma or a capacitively coupled plasma or a microwave plasma. Power for an inductively coupled plasma may be set at between about 50 W and about 2000 W, such as about 900 W. Power may be set at a low enough level so as not to cause direct plasma etching of the substrate.

In some embodiments, a plasma is not used and chlorine may be introduced thermally into the chamber. The energy of dissociation of $Cl_2$ to Cl is 2.51 eV. In some embodiments, this energy may be applied using thermal or other radiative energy sources during this operation. In some embodiments, chlorine may be heated at sufficiently high temperatures to decompose chlorine into chlorine atoms capable of adsorbing onto the surface of a substrate.

In various embodiments, a bias is applied during operation 315. A low bias power may be used to prevent spontaneous etching by the modification chemistry on the surface of the substrate while allowing the modification chemistry adsorb on the surface of the deposited metal and enter a seam that may be formed at or near the opening of a feature. For example, a bias may be applied between about 0V and about 200V. The bias may be used to establish a gradient of modification chemistry throughout the feature depth. By appropriately controlling the bias as well as other parameters such as pressure, the degree of modification (and of ALE) can be controlled throughout the feature depth. In one example, more chlorine may be adsorbed at or near the top of features, or at or near the openings of features, than in the bottom and on the side walls. The bias is applied in such a way so as not to cause physical sputtering of the substrate. In some embodiments, a bias may not be used. In some embodiments, a bias may not be used if the openings of features are large enough. An example pressure range during operation 315 may be between about 30 mTorr and about 80 mTorr.

In some embodiments, a purge may be performed after a modification operation. In a purge operation, non-surface-bound active chlorine species may be removed from the process chamber. This can be done by purging and/or evacuating the process chamber to remove non-adsorbed modification chemistry, without removing the adsorbed layer. The species generated in a chlorine-based plasma can be removed by stopping the plasma and allowing the remaining species to decay, optionally combined with purging and/or evacuation of the chamber. Purging can be done using any inert gas such as $N_2$, Ar, Ne, He, and their combinations.

In operation 335, the modified layer is removed from the substrate using an activated removal gas, such as an activating gas, ion bombardment gas, or chemically reactive gas. The activated removal gas may be an inert gas. For example, argon may be used. In some embodiments, neon or krypton may be used. In a removal operation, the substrate may be exposed to an energy source (e.g. activating or ion bombardment gas or chemically reactive species that induces removal), such as argon or helium, to etch the substrate by directional ion bombardment. In some embodiments, the removal operation may be performed by low energy ion bombardment. In some embodiments, removal may be isotropic.

The amount of removal gas may be controlled such as to etch only a targeted amount of material. In various embodiments, the pressure of the chamber may vary between the modification and removal operations. The pressure of the removal gas may depend on the size of the chamber, the flow rate of the removal gas, the temperature of the reactor, the type of substrate, the flow rate of any carrier gases, and the amount of tungsten to be etched. An example pressure range during operation 335 may be between about 1 mTorr and about 15 mTorr.

During removal, a bias may be optionally applied to facilitate directional ion bombardment. The bias power is selected to prevent sputtering but allow the removal gas to enter the feature and etch the tungsten at or near the opening of the feature to thereby open it. The bias power may be selected depending on the threshold sputter yield of the activated removal gas with the deposited metal on the substrate. Sputtering as used herein may refer to physical removal of at least some of a surface of a substrate. Ion bombardment may refer to physical bombardment of a species onto a surface of a substrate.

Figure 4:
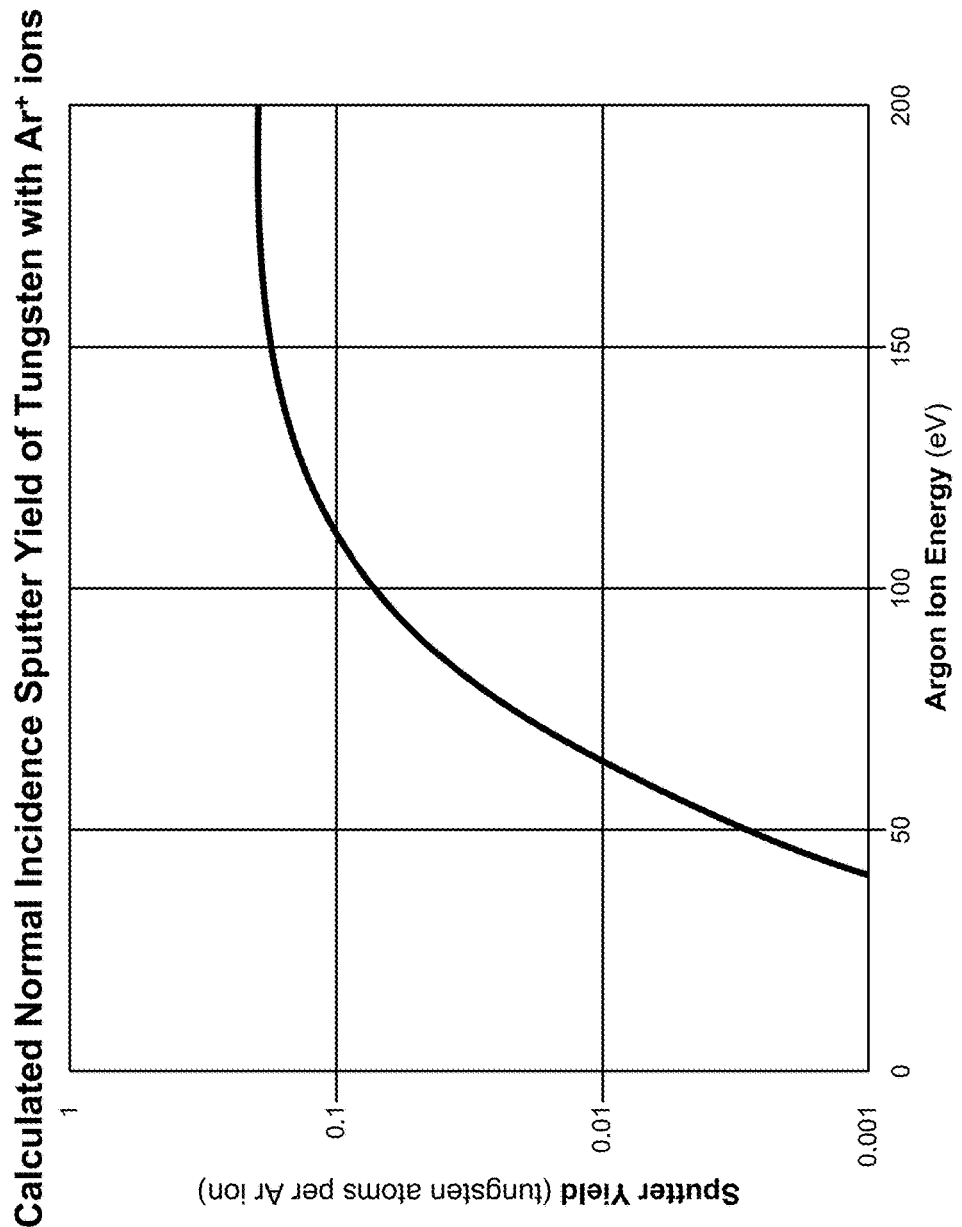
FIG. 4 is a graph of calculated normal incident sputter yield of tungsten using argon ions.

FIG. 4 shows an example sputter yield calculated based on "Energy Dependence of the Yields of Ion-Induced Sputtering of Monatomic Solids" by N. Matsunami, Y. Yamamura, Y. Itikawa, N. Itoh, Y. Kazumata, S. Miyagawa, K. Morita, R. Shimizu, and H. Tawara, IPPJ-AM-32 (Institute of Plasma Physics, Nagoya University, Japan, 1983).

The figure shows the calculated normal incidence sputter yield of tungsten with argon atoms versus argon ion energy (or threshold bias power). The calculation used a value of 32 eV for the sputter threshold. Slightly above the threshold, namely at 40 eV argon ion energy, the sputter yield seems to be about 0.001 atoms/ion. However, at 80 eV ion energy, it has increased by a factor of 30. This example curve indicates the maximum argon ion energy sufficient to etch the metal while preventing sputtering of argon on the substrate. While FIG. 4 provides a qualitative representation of a sputter threshold curve, a sputter threshold may be experimentally determined for a particular system and maximum tolerable sputter yield. For one system, sputtering of tungsten is observed at 80 Vb for argon ions. As such, the bias power during tungsten removal using argon ions may be set at less than about 80 Vb, or less than about 50 Vb, or between about 50 Vb and 80 Vb. In some embodiments, operation 335 may be performed above the threshold bias power if some small amount of sputtering is tolerable. There may also be a removal threshold voltage, below which removal does not occur, depending on the particular process. It should be noted that the sputter threshold varies according to the metal, metal compound, or other material to be etched.

In some embodiments, the chamber may be purged after a removal operation. Purge processes may be any of those used for a purge after operation 315.

Returning to FIG. 3, operations 315 and 335 may be optionally repeated as necessary to fill the feature. In operation 307, it is determined whether the feature has been sufficiently filled. If not, operations 303 and 305 may be repeated. In some embodiments, operation 303 is repeated and the feature may be sufficiently filled such that operation 305 may not be performed again. In some embodiments, operations 303 and 305 are performed until features are sufficiently filled. In some embodiments, features may be sufficiently filled after performing operation 303 in one of the repeated operations, such that operation 305 is not performed after features are filled. In some embodiments, operations 303 and 305 are performed in the same chamber. In some embodiments, operations 303 and 305 are performed in the same tool. In some embodiments, operations 303 and 305 are performed without breaking vacuum. In some embodiments, repeated cycles of operation 303 may involve different deposition methods and precursors than in prior cycles of operation 303. For example, in one process, tungsten may be deposited into a feature by ALD, ALE may be performed to etch the deposited tungsten to open the feature, and tungsten deposition may be repeated by this time performing CVD of tungsten using a tungsten-containing precursor and a reducing agent to completely fill the feature. In another example, tungsten is deposited by alternating pulses of $WF_6$ and $BH_4$, the tungsten at or near the opening of a feature may be etched by alternating pulses of $Cl_2$ and Ar in the presence of a plasma and applying a bias, and tungsten may be deposited by simultaneous exposure to $WCl_5$ and $H_2$.

Figure 5:
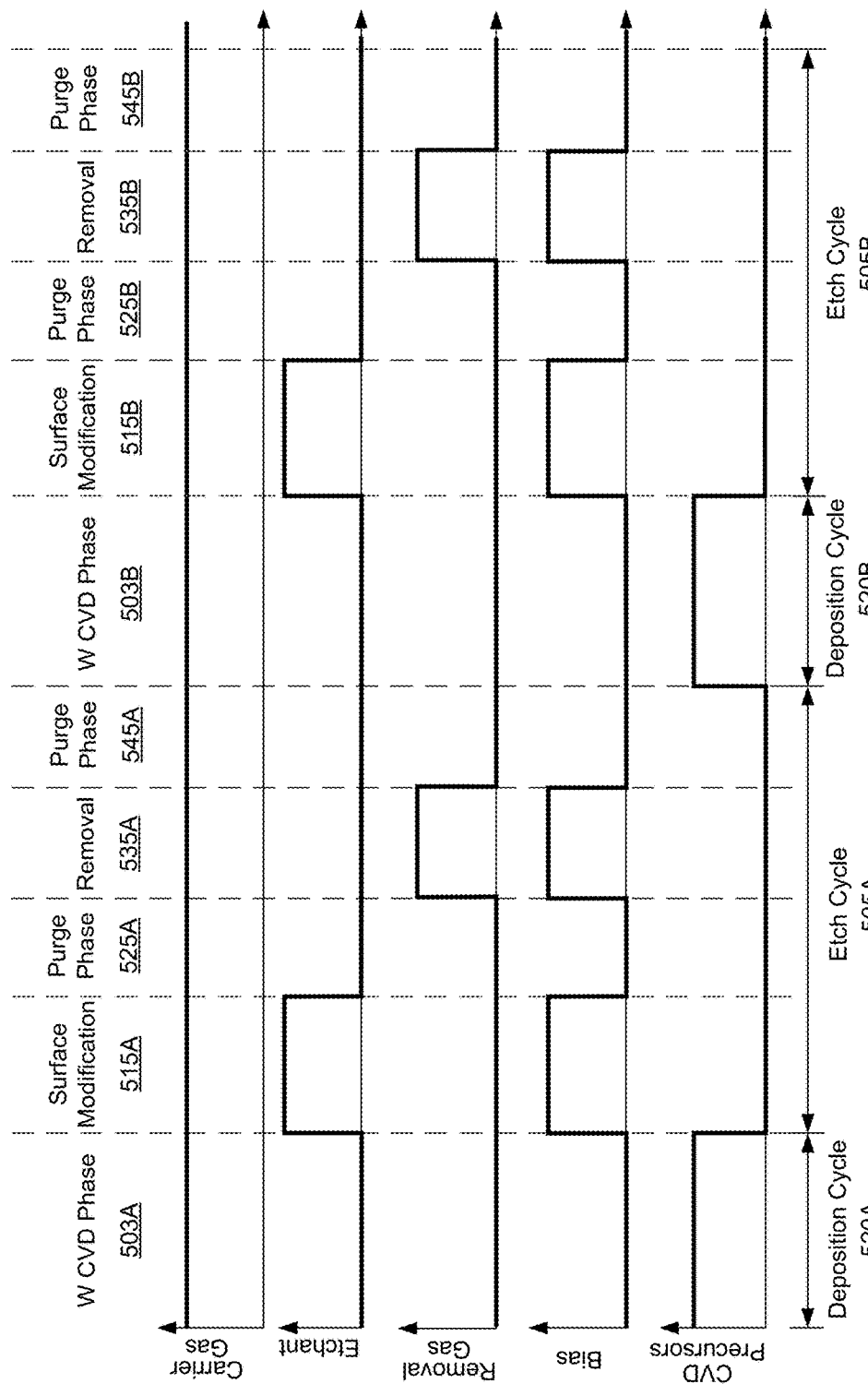
FIG. 5 is a timing schematic diagram depicting an example of operations performed in accordance with certain disclosed embodiments.

FIG. 5 provides an example diagram of a timing scheme that may be performed in accordance with disclosed embodiments. Process 500 includes deposition cycle 520A, etch cycle 505A, and a repeated deposition cycle 520B and etch cycle 505B. Deposition cycle 520A includes W CVD phase 503A, which may correspond to operation 303 of FIG. 3. Although a CVD deposition is provided in FIG. 5, in some embodiments, this operation may involve cyclic deposition of a metal, such as by ALD. In W CVD phase 503A, the carrier gas may be flowed, while the modification chemistry flow is turned off and the removal gas is turned off. CVD Precursors may be continuously flowed to deposit tungsten and the bias is turned off. Etch cycle 505A may correspond to operations 315 and 335 of FIG. 3. Etch cycle 505A includes a surface modification 515A, which may correspond to operation 315 of FIG. 3. During surface modification 515A, the modification chemistry is flowed with a carrier gas while the removal gas and CVD precursor flows are turned off. The bias may be on, as shown in FIG. 5. Following surface modification 515A may be a purge phase 525A, which, as described above, is an optional operation. During purge phase 525A, the carrier gas is continuously flowed to remove any modification chemistry that did not adsorb onto the substrate. Accordingly, modification chemistry, removal gas, and CVD precursor flows are turned off, and the bias is also turned off. In removal phase 535A, the carrier gas is continuously flowed while the removal gas is flowed, while the modification chemistry and CVD precursor flows are turned off. The bias may also be turned on during removal phase 535A. Removal phase 535A may correspond to operation 335 of FIG. 3. In various embodiments, a plasma is ignited during this phase. Purge phase 545A may involve flowing a carrier gas while modification chemistry, removal gas, and CVD precursor flows are turned off, and the bias is also turned off.

In accordance with operation 307 of FIG. 3, the operations may be repeated as shown in FIG. 5. Deposition cycle 520B involves W CVD Phase 503B, which in this example includes the same flows as in W CVD Phase 503A. Here, a carrier gas is flowed with CVD precursors to deposit tungsten, while removal gas and modification chemistry flows are turned off, and the bias is turned off. In some embodiments, this may further partially fill a feature. Although the same precursors may be used in W CVD Phase 503B as in W CVD Phase 503A, in some embodiments, as described above, a repeated operation of 303 of FIG. 3 may involve different deposition techniques or precursors. Etch cycle 505B may correspond to operation 305 of FIG. 3 in a repeated cycle. Etch cycle 505B involves a surface modification 515B, whereby the carrier gas and modification chemistry are flowed while removal gas and CVD precursor flows are turned off, and a bias is turned on. Purge phase 525B includes carrier gas flow while all other flows are turned off, and the bias is turned off. Removal phase 535B involves flowing carrier gas with removal gas, while the modification chemistry and CVD precursor flows are turned off. In various embodiments, a plasma is ignited during this phase. The bias is turned on to directionally etch the substrate. Purge phase 545B involves flowing carrier gas without flowing modification chemistry, removal gas, or CVD precursors while the bias is turned off.

Embodiments described herein may be integrated with other processes. For example, ALE etching can be integrated on a MSSD (Multi-Station-Sequential-Deposition) chamber architecture in which one of deposition stations can be replaced by an ALE station to allow integrated deposition/etch/deposition using a similar chemistry for better fill and faster throughput capability. Disclosed embodiments may be performed in some embodiments without breaking vacuum. For example, in some embodiments, disclosed embodiments may be performed in the same chamber or in the same tool. Further examples of apparatuses suitable for performing disclosed embodiments are described further below.

Apparatus

Inductively coupled plasma (ICP) reactors which, in certain embodiments, may be suitable for atomic layer etching (ALE) operations and atomic layer deposition (ALD) operations are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 6:
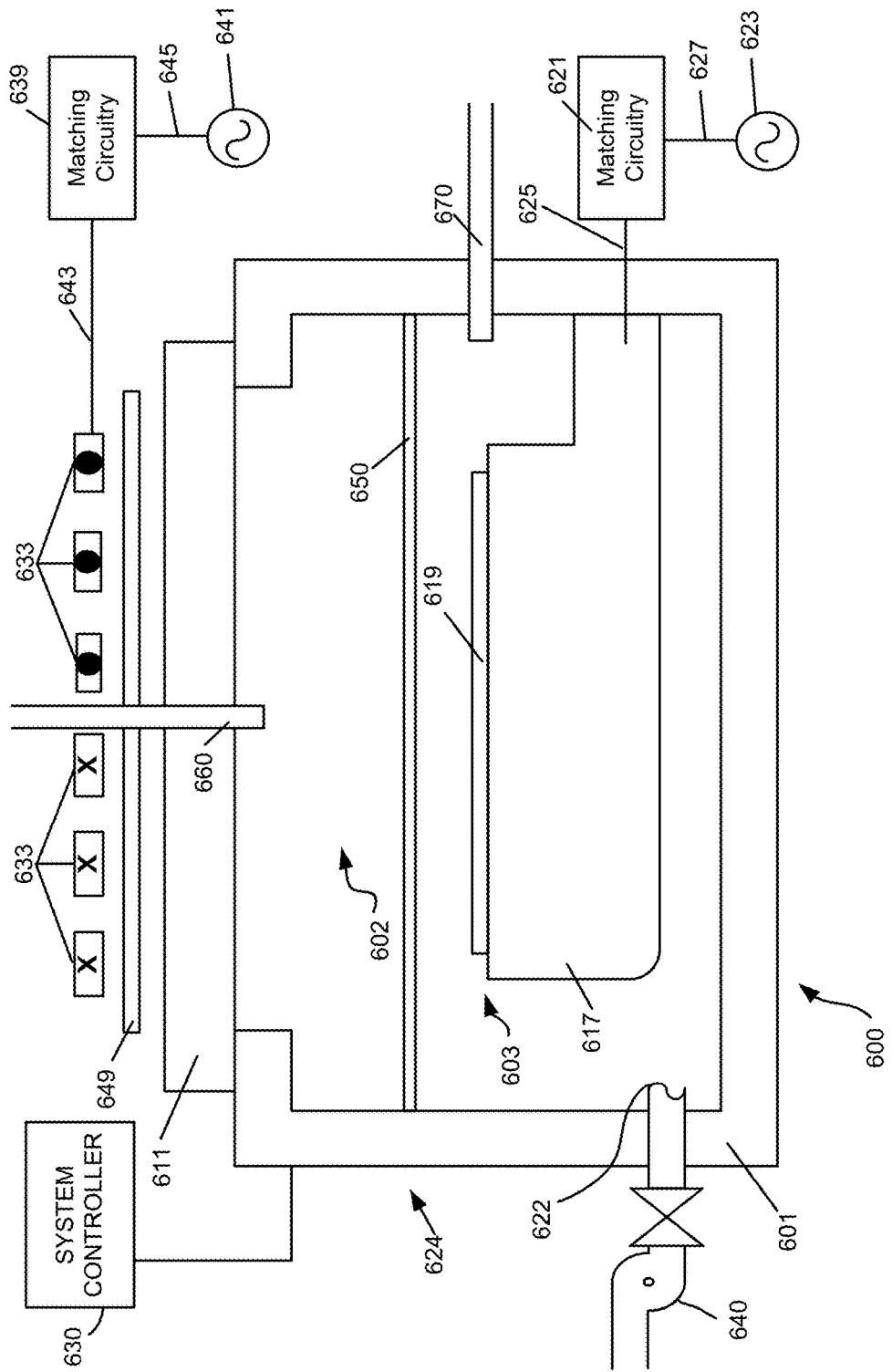
FIG. 6 is a schematic diagram of an example process chamber for performing certain disclosed embodiments.

FIG. 6 schematically shows a cross-sectional view of an inductively coupled plasma integrated etching and deposition apparatus 600 appropriate for implementing certain embodiments herein, an example of which is a Kiyo® reactor, produced by Lam Research Corp. of Fremont, Calif. The inductively coupled plasma apparatus 600 includes an overall process chamber 624 structurally defined by chamber walls 601 and a window 611. The chamber walls 601 may be fabricated from stainless steel or aluminum. The window 611 may be fabricated from quartz or other dielectric material. An optional internal plasma grid 650 divides the overall process chamber 624 into an upper sub-chamber 602 and a lower sub-chamber 603. In most embodiments, plasma grid 650 may be removed, thereby utilizing a chamber space made of sub-chambers 602 and 603. A chuck 617 is positioned within the lower sub-chamber 603 near the bottom inner surface. The chuck 617 is configured to receive and hold a semiconductor substrate or wafer 619 upon which the etching and deposition processes are performed. The chuck 617 can be an electrostatic chuck for supporting the wafer 619 when present. In some embodiments, an edge ring (not shown) surrounds chuck 617, and has an upper surface that is approximately planar with a top surface of the wafer 619, when present over chuck 617. The chuck 617 also includes electrostatic electrodes for chucking and dechucking the wafer 619. A filter and DC clamp power supply (not shown) may be provided for this purpose. Other control systems for lifting the wafer 619 off the chuck 617 can also be provided. The chuck 617 can be electrically charged using an RF power supply 623. The RF power supply 623 is connected to matching circuitry 621 through a connection 627. The matching circuitry 621 is connected to the chuck 617 through a connection 625. In this manner, the RF power supply 623 is connected to the chuck 617.

Elements for plasma generation include a coil 633 is positioned above window 611. In some embodiments, a coil is not used in disclosed embodiments. The coil 633 is fabricated from an electrically conductive material and includes at least one complete turn. The example of a coil 633 shown in FIG. 6 includes three turns. The cross-sections of coil 633 are shown with symbols, and coils having an "X" extend rotationally into the page, while coils having a "●" extend rotationally out of the page. Elements for plasma generation also include an RF power supply 641 configured to supply RF power to the coil 633. In general, the RF power supply 641 is connected to matching circuitry 639 through a connection 645. The matching circuitry 639 is connected to the coil 633 through a connection 643. In this manner, the RF power supply 641 is connected to the coil 633. An optional Faraday shield 649 is positioned between the coil 633 and the window 611. The Faraday shield 649 is maintained in a spaced apart relationship relative to the coil 633. The Faraday shield 649 is disposed immediately above the window 611. The coil 633, the Faraday shield 649, and the window 611 are each configured to be substantially parallel to one another. The Faraday shield 649 may prevent metal or other species from depositing on the window 611 of the process chamber 624.

Process gases (e.g. metal precursors such as tungsten-containing precursors, reducing agents, carrier gases, halogen-containing gases, chlorine, argon, etc.) may be flowed into the process chamber through one or more main gas flow inlets 660 positioned in the upper sub-chamber 602 and/or through one or more side gas flow inlets 670. Likewise, though not explicitly shown, similar gas flow inlets may be used to supply process gases to a capacitively coupled plasma processing chamber. A vacuum pump 640, e.g., a one or two stage mechanical dry pump and/or turbomolecular pump, may be used to draw process gases out of the process chamber 624 and to maintain a pressure within the process chamber 624. For example, the vacuum pump 640 may be used to evacuate the lower sub-chamber 603 during a purge operation of ALE. A valve-controlled conduit may be used to fluidically connect the vacuum pump to the process chamber 624 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 600, one or more process gases may be supplied through the gas flow inlets 660 and/or 670. In certain embodiments, process gas may be supplied only through the main gas flow inlet 660, or only through the side gas flow inlet 670. In some cases, the gas flow inlets shown in the figure may be replaced by more complex gas flow inlets, one or more showerheads, for example. The Faraday shield 649 and/or optional grid 650 may include internal channels and holes that allow delivery of process gases to the process chamber 624. Either or both of Faraday shield 649 and optional grid 650 may serve as a showerhead for delivery of process gases. In some embodiments, a liquid vaporization and delivery system may be situated upstream of the process chamber 624, such that once a liquid reactant or precursor is vaporized, the vaporized reactant or precursor is introduced into the process chamber 624 via a gas flow inlet 660 and/or 670.

Radio frequency power is supplied from the RF power supply 641 to the coil 633 to cause an RF current to flow through the coil 633. The RF current flowing through the coil 633 generates an electromagnetic field about the coil 633. The electromagnetic field generates an inductive current within the upper sub-chamber 602. The physical and chemical interactions of various generated ions and radicals with the wafer 619 etch features of and deposit layers on the wafer 619.

Volatile etching and/or deposition byproducts may be removed from the lower sub-chamber 603 through port 622. The chuck 617 disclosed herein may operate at elevated temperatures ranging between about 10° C. and about 250° C. The temperature will depend on the process operation and specific recipe.

Apparatus 600 may be coupled to facilities (not shown) when installed in a clean room or a fabrication facility. Facilities include plumbing that provide processing gases, vacuum, temperature control, and environmental particle control. These facilities are coupled to apparatus 600, when installed in the target fabrication facility. Additionally, apparatus 600 may be coupled to a transfer chamber that allows robotics to transfer semiconductor wafers into and out of apparatus 600 using typical automation.

In some embodiments, a system controller 630 (which may include one or more physical or logical controllers) controls some or all of the operations of a process chamber 624. The system controller 630 may include one or more memory devices and one or more processors. For example, the memory may include instructions to alternate between flows of modification chemistry such as a chlorine-containing modification chemistry and a removal gas such as argon, or instructions to ignite a plasma or apply a bias. For example, the memory may include instructions to set the bias at a power between about 0V and about 200V during some operations. In some embodiments, the apparatus 600 includes a switching system for controlling flow rates and durations when disclosed embodiments are performed. In some embodiments, the apparatus 600 may have a switching time of up to about 500 ms, or up to about 750 ms. Switching time may depend on the flow chemistry, recipe chosen, reactor architecture, and other factors.

In some embodiments, disclosed embodiments can be integrated on a MSSD (Multi-Station-Sequential-Deposition) chamber architecture in which one of deposition stations can be replaced by an ALE station to allow an integrated deposition/etch/deposition process using a similar chemistry for better fill and faster throughput capability.

In some implementations, the system controller 630 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 630, which may control various components or subparts of the system or systems. The system controller 630, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 630 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 630, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 630 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 630 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 7:
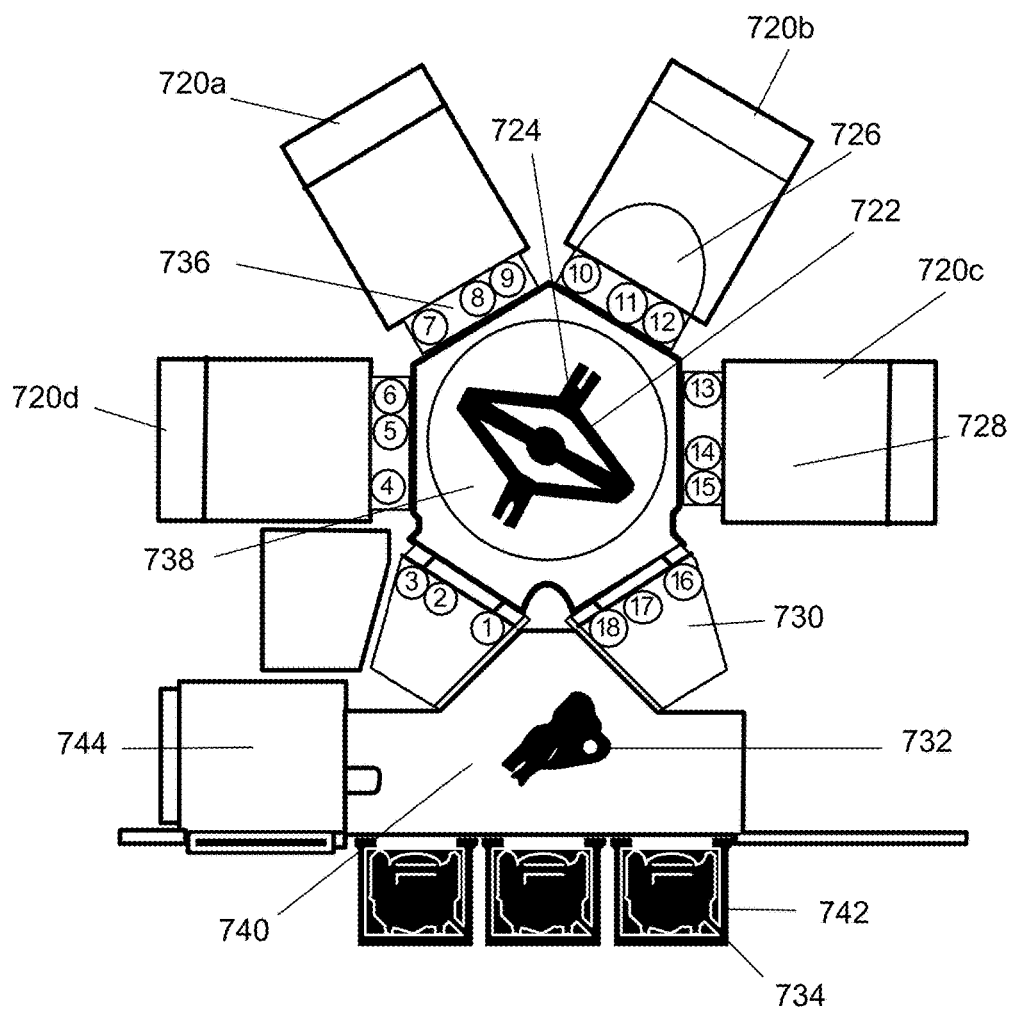
FIG. 7 is a schematic diagram of an example process apparatus for performing certain disclosed embodiments.

FIG. 7 depicts a semiconductor process cluster architecture with various modules that interface with a vacuum transfer module 738 (VTM). The arrangement of various modules to "transfer" wafers among multiple storage facilities and processing modules may be referred to as a "cluster tool architecture" system. Airlock 730, also known as a loadlock or transfer module, interfaces with the VTM 738 which, in turn, interfaces with four processing modules 720a-720d, which may be individual optimized to perform various fabrication processes. By way of example, processing modules 720a-720d may be implemented to perform substrate etching, deposition, ion implantation, wafer cleaning, sputtering, and/or other semiconductor processes. In some embodiments, ALD and ALE are performed in the same module. In some embodiments, ALD and ALE are performed in different modules of the same tool. One or more of the substrate etching processing modules (any of 720a-720d) may be implemented as disclosed herein, i.e., for depositing conformal films, directionally etching films by ALE, etching patterns, and other suitable functions in accordance with the disclosed embodiments. Airlock 730 and processing modules 720a-720d may be referred to as "stations." Each station has a facet 736 that interfaces the station to VTM 738. Inside each facet, sensors 1-18 are used to detect the passing of wafer 726 when moved between respective stations.

Robot 722 transfers wafer 726 between stations. In one embodiment, robot 722 has one arm, and in another embodiment, robot 722 has two arms, where each arm has an end effector 724 to pick wafers such as wafer 726 for transport. Front-end robot 732, in atmospheric transfer module (ATM) 740, is used to transfer wafers 726 from cassette or Front Opening Unified Pod (FOUP) 734 in Load Port Module (LPM) 742 to airlock 730. Module center 728 inside processing module 720a-720d is one location for placing wafer 726. Aligner 744 in ATM 740 is used to align wafers.

In an exemplary processing method, a wafer is placed in one of the FOUPs 734 in the LPM 742. Front-end robot 732 transfers the wafer from the FOUP 734 to an aligner 744, which allows the wafer 726 to be properly centered before it is etched or processed. After being aligned, the wafer 726 is moved by the front-end robot 732 into an airlock 730. Because the airlock 730 has the ability to match the environment between an ATM 740 and a VTM 738, the wafer 726 is able to move between the two pressure environments without being damaged. From the airlock 730, the wafer 726 is moved by robot 722 through VTM 738 and into one of the processing modules 720a-720d. In order to achieve this wafer movement, the robot 722 uses end effectors 724 on each of its arms. Once the wafer 726 has been processed, it is moved by robot 722 from the processing modules 720a-720d to the airlock 730. From here, the wafer 726 may be moved by the front-end robot 732 to one of the FOUPs 734 or to the aligner 744.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 6 may be implemented with the tool in FIG. 7.

EXPERIMENTAL

Experiment 1

Figure 8:
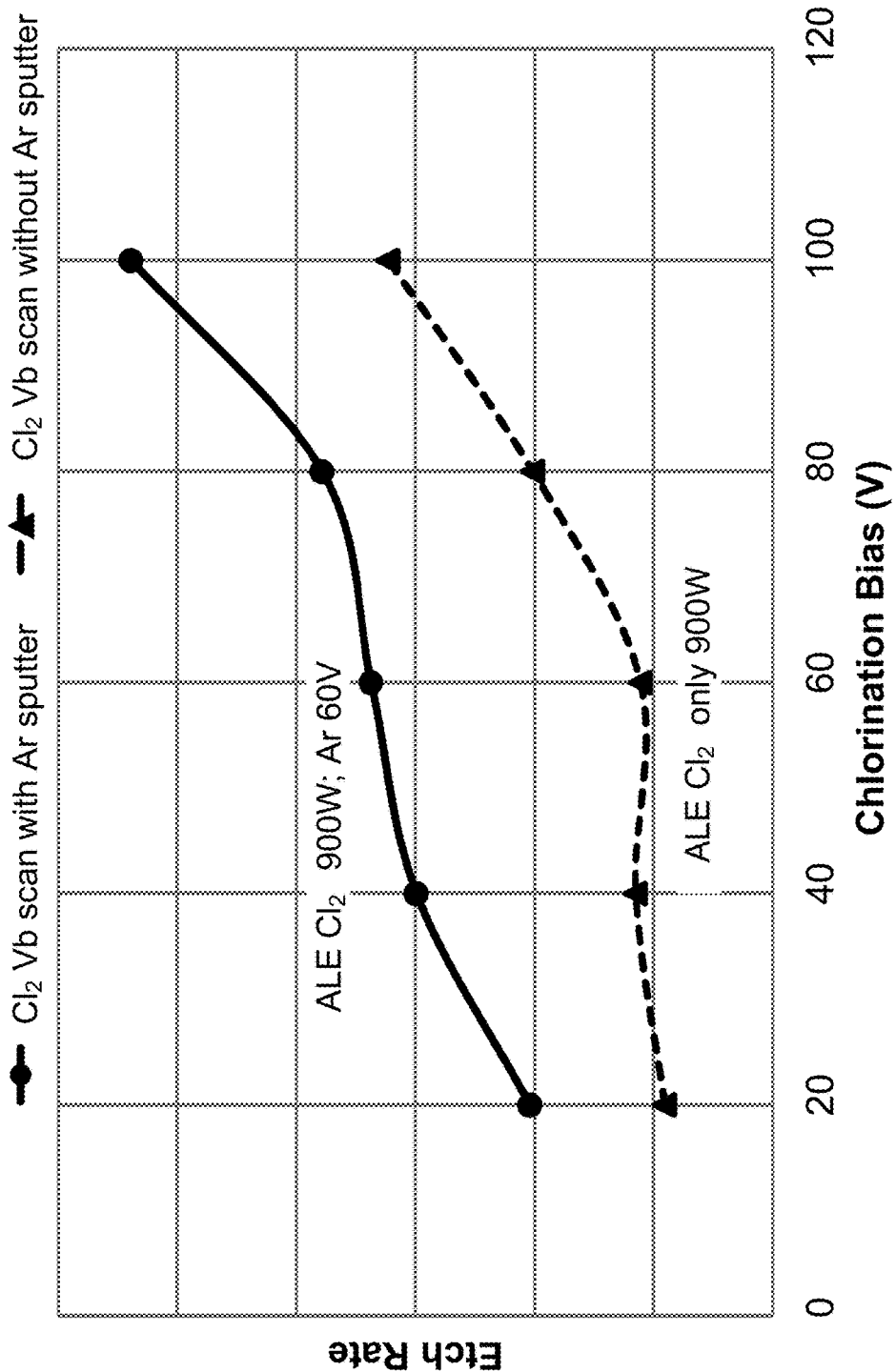
FIG. 8 is a graph of experimental data collected for etch rates of tungsten over chlorination bias power.

Etch rate of tungsten was plotted against chlorination bias power for etch with chlorine adsorption and no argon sputtering, as well as for an atomic layer etch (ALE) process with chlorine adsorption with argon sputtering. The results are plotted in FIG. 8. The dotted line depicts the etch rate of tungsten versus chlorination bias (e.g., the bias power during chlorine adsorption) for a process involving adsorbing chlorine and igniting a plasma at 900 W, and no argon sputtering. The solid line depicts the etch rate of tungsten versus chlorination bias for a process involving adsorbing chlorine and igniting a plasma at 900 W, followed by an argon bombardment with a bias power of 60V. A chlorination bias threshold voltage as shown in FIG. 8 is at about 60V. Note where a chlorination bias is less than 60V, tungsten is not etched without using ion bombardment of argon. Where a chlorination bias is greater than 60V, the etch rate of tungsten without argon ion bombardment is much lower than that of the process with argon ion bombardment. These results suggest that argon ion bombardment may be used to modulate the etch rate of tungsten by ALE methods in various embodiments whereby 1) chlorine is being adsorbed onto the tungsten substrate without etching during chlorination, and 2) the bias power during ion bombardment of argon is controlled to reduce or prevent physical removal (or sputtering) by setting the bias power lower than the sputter threshold.

Experiment 2

Figure 9A:
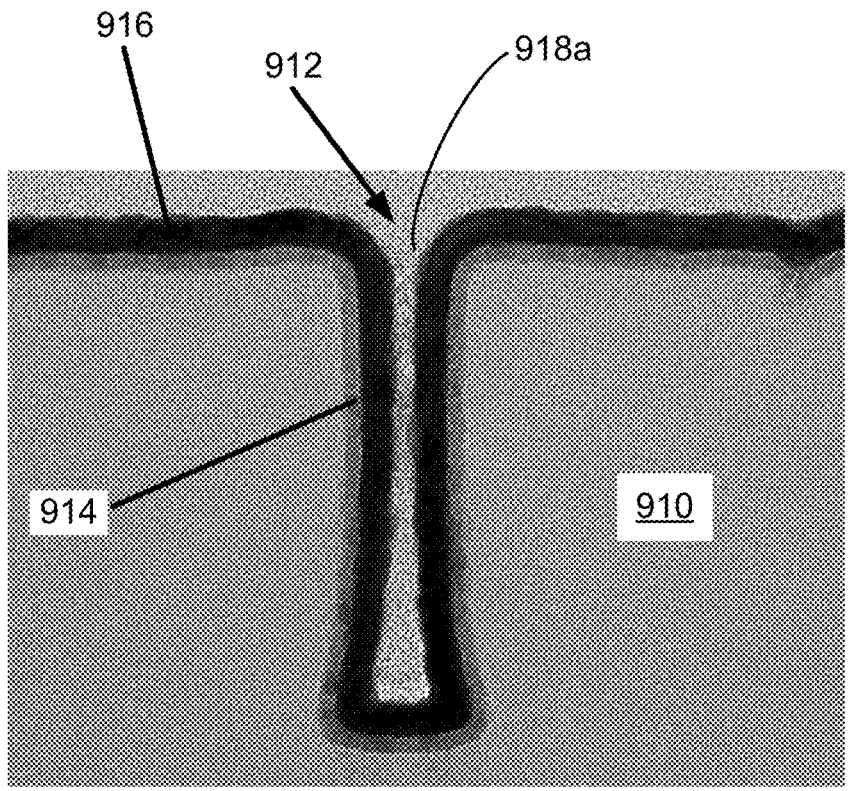
FIG. 9A is an image of a feature with tungsten.

An experiment was conducted on a substrate with a feature to be filled with tungsten. The feature was lined with a titanium nitride (TiN) barrier layer. Tungsten was nucleated on the surface of the feature and tungsten was deposited by atomic layer deposition (alternating pulses of $WF_6$ and $B_2H_6$). FIG. 9A shows a 20 nm feature 912 in a substrate 910 lined with TiN barrier layer 914 and a conformally tungsten layer 916. An opening 918a is shown at the top of the feature.

Figure 9B:
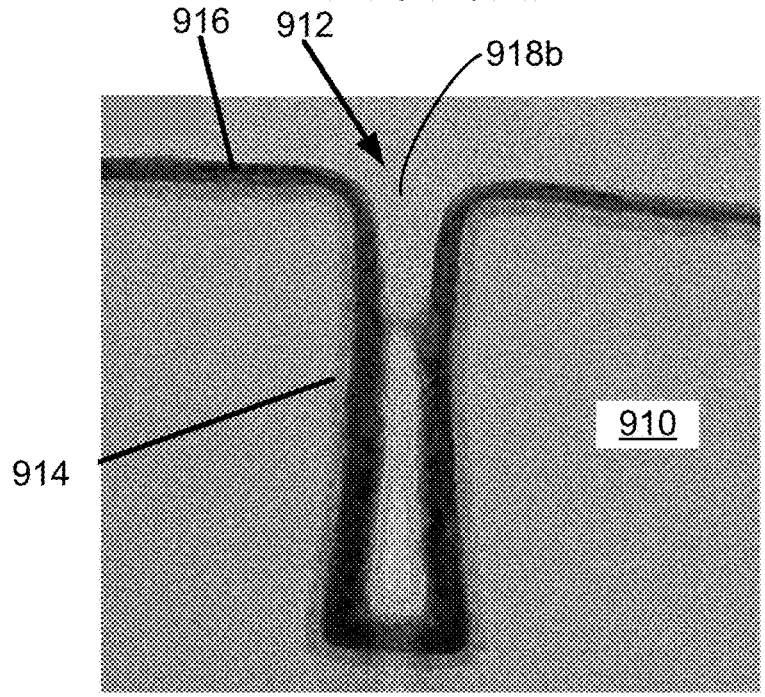
FIG. 9B is an image of a feature with tungsten deposited in accordance with certain disclosed embodiments.

The substrate in FIG. 9A is exposed to 10 cycles of ALE involving alternating pulses of (1) $Cl_2/BCl_3$ with an in situ inductively coupled plasma power of 900 W and no bias at 60° C., and (2) argon gas at a lower pressure than (1) with a 300 W plasma and a 60 Vb bias at 60° C. The resulting substrate is shown in FIG. 9B. Note the opening 918b is opened to thereby allow subsequent deposition of tungsten into the feature to completely fill the feature. Table 1 below shows the measurements for the thickness of tungsten deposited in various parts of the substrate, as well as the trench opening and average thickness of the TiN barrier. Measurements are shown in nanometers.

TABLE 1

Pre and Post ALE Measurements

| Measurements (nm) | | Pre-ALE nm | 10 cycles of ALE nm | nm/cycle |
|---|---|---|---|---|
| W film thickness | Top surface | 6.9 | 3.3 | 0.36 |
| | Top corner | 6.1 | 3.0 | 0.31 |
| | Trench sidewall, 1/6 trench depth | 5.9 | 4.4 | 0.15 |
| | Trench sidewall, 1/3 trench depth | 5.8 | 5.0 | 0.08 |
| | Trench sidewall, 7/8 trench depth | 5.9 | 5.9 | 0.00 |
| | Trench bottom | 5.7 | 5.3 | 0.04 |
| Average TiN barrier | | 3.0 | 3.0 | |

The substrate was further exposed to 5 more cycles of ALE involving alternating pulses of (1) $Cl_2/BCl_3$ with an in situ inductively coupled plasma power of 900 W and no bias at 60° C., and (2) argon gas at a lower pressure than (1) with a 300 W plasma and a 60 Vb bias at 60° C. The resulting measurements are shown in Table 2 below.

TABLE 2

Pre and Post ALE Measurements

| Measurements (nm) | | Pre-ALE nm | 15 cycles of ALE nm | nm/cycle |
|---|---|---|---|---|
| W film thickness | Top surface | 6.9 | 2.0 | 0.49 |
| | Top corner | 6.1 | 1.4 | 0.47 |
| | Trench sidewall, 1/6 trench depth | 5.9 | 4.1 | 0.18 |
| | Trench sidewall, 1/3 trench depth | 5.8 | 3.9 | 0.19 |
| | Trench sidewall, 7/8 trench depth | 5.9 | 5.6 | 0.03 |
| | Trench bottom | 5.7 | 5.0 | 0.07 |
| Average TiN barrier | | 3.0 | 3.0 | |

These results suggest that disclosed embodiments allow for precise control of the amount of tungsten film etched depending on the number of cycles, the parameters, and other factors. For example, to etch more tungsten, more cycles may be performed. The results in Table 2 suggest some tungsten recess due to the ALE process but subsequent cycles of deposition of tungsten can recover the tungsten etched in ALE. The TiN barrier remains on the substrate, and etch cycles of ALE may be modulated to ensure that there remains sufficient tungsten on the surface of the feature so as not to expose the TiN barrier layer.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of filling features on a substrate, the method comprising:
   (a) depositing a first amount of a metal in a feature; and
   (b) preferentially etching the deposited first amount of the metal at or near an opening of the feature relative to an interior region of the feature by
      (i) modifying a surface of the deposited first amount of the metal by exposing the metal to a halogen-containing gas, wherein the surface is modified preferentially at or near the opening of the feature relative to the interior region of the feature; and
      (ii) exposing the modified surface to an activation gas to preferentially etch the metal at or near the opening of the feature relative to the interior region of the feature.

2. The method of claim 1, wherein the metal contains one of titanium, tantalum, nickel, cobalt, or molybdenum.

3. The method of claim 1, wherein the metal contains tungsten.

4. The method of claim 1, further comprising applying a bias during at least one of (i) and (ii).

5. The method of claim 4, wherein the bias is applied at a voltage less than the voltage at which the halogen-containing gas or the activation gas sputters the metal.

6. The method of claim 1, wherein (b) comprises a self-limiting reaction.

7. The method of claim 1, wherein the substrate comprises features having different size openings.

8. The method of claim 1, wherein (a) and (b) are performed without breaking vacuum.

9. The method of claim 1, further comprising igniting a plasma during at least one of (i) and (ii).

10. The method of claim 1, wherein the halogen-containing gas is selected from the group consisting of chlorine, bromine, iodine, sulfur hexafluoride, silicon tetrafluoride, boron trichloride, and combinations thereof.

11. The method of claim 9, wherein the plasma is ignited using power between about 0 W and about 1000 W.

12. The method of claim 4, wherein the bias is applied at a voltage less than about 80 Vb.

13. The method of claim 1, wherein the activation gas is selected from a group consisting of neon, krypton, and argon.

14. A method of filling features on a substrate, the method comprising:
   (a) partially filling a feature with a first amount of tungsten;
   (b) preferentially etching the first amount of tungsten at or near an opening of the feature relative to an interior region of the feature by exposing the substrate to alternating pulses of a halogen-containing gas and an activation gas, wherein a pulse of the halogen-containing gas preferentially adsorbs to the first amount of tungsten at or near the opening of the feature relative to the interior region of the feature; and (c) after the preferentially etching, depositing a second amount of tungsten in the feature.

15. The method of claim 14, wherein a bias is applied during (b).

16. The method of claim 14, wherein a bias is applied during (b) at a voltage less than the voltage at which the halogen-containing gas or the activation gas sputters the first amount of tungsten.

17. The method of claim 14, wherein (a) and (b) are performed without breaking vacuum.

18. The method of claim 14, wherein at least one of the first amount of the tungsten and the second amount of the tungsten is deposited using a chlorine-containing tungsten precursor.

19. The method of claim 14, wherein at least one of the first amount of the tungsten and the second amount of the tungsten is fluorine-free tungsten.

* * * * *